(12) United States Patent
Kanda

(10) Patent No.: US 7,550,250 B2
(45) Date of Patent: Jun. 23, 2009

(54) POSITIVE RESIST COMPOSITION AND PATTERN FORMING METHOD USING THE SAME

(75) Inventor: Hiromi Kanda, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 12 days.

(21) Appl. No.: 11/645,780

(22) Filed: Dec. 27, 2006

(65) Prior Publication Data

US 2007/0148595 A1 Jun. 28, 2007

(30) Foreign Application Priority Data

Dec. 27, 2005 (JP) ............................. 2005-375556

(51) Int. Cl.
G03F 7/00 (2006.01)
G03F 7/004 (2006.01)
(52) U.S. Cl. .................... 430/270.1; 430/905; 430/913; 430/311
(58) Field of Classification Search ........................ None
See application file for complete search history.

(56) References Cited

U.S. PATENT DOCUMENTS

| 2005/0130444 A1 | 6/2005 | Rogalli et al. |
| 2006/0246373 A1 | 11/2006 | Wang |
| 2007/0002296 A1* | 1/2007 | Chang et al. ................... 355/53 |

FOREIGN PATENT DOCUMENTS

| EP | 1500977 A1 * | 1/2005 |
| EP | 1 589 375 A1 | 10/2005 |
| EP | 1 764 652 A2 | 3/2007 |
| JP | 57-153433 A | 9/1982 |
| JP | 7-220990 A | 8/1995 |
| JP | 2002-196497 A | 7/2002 |
| WO | WO 2004/068242 A1 | 8/2004 |
| WO | WO 2004-077158 A1 | 9/2004 |

OTHER PUBLICATIONS

Extended European Search Report Dated May 14, 2007.
B.J. Lin "Semiconductor Foundry, Lithography, and Partners" Micropatterning Division TSMC, Inc., SPIE vol. 4688 (2002), pp. 11-24.
J.A. Hoffnagle, et al. "Liquid Immersion Deep-Ultraviolet Interferometric Lithography" J. Vac. Sci. Technol. B 17(6), Nov./Dec. 1998 American Vacuum Society, pp. 3306-3309.

* cited by examiner

Primary Examiner—Amanda C. Walke
(74) Attorney, Agent, or Firm—Sughrue Mion, PLLC

(57) ABSTRACT

A positive resist composition, which comprises: (A) a resin having a monocyclic or polycyclic alicyclic hydrocarbon structure, of which solubility in an alkali developer increases under an action of an acid; (B) a compound capable of generating an acid upon irradiation with actinic rays or radiation; (C) a resin having a repeating unit represented by formula (C) as defined in the specification; and (D) a solvent, wherein a content of the resin as the component (C) is from 0.1 to 20 mass % based on a solid content of the positive resist composition, and a pattern forming method using the same.

17 Claims, 1 Drawing Sheet

POSITIVE RESIST COMPOSITION AND PATTERN FORMING METHOD USING THE SAME

BACKGROUND OF THE INVENTION

1. Field of the Invention

The present invention relates to a positive resist composition for use in the production process of a semiconductor such as IC, in the production of a circuit substrate of liquid crystal, thermal head or the like, and in the lithography process of other photo-applications, and a pattern forming method using the positive resist composition. More specifically, the present invention relates to a positive resist composition suitable for exposure by an immersion-type projection exposure apparatus using a light source of emitting far ultraviolet light at a wavelength of 300 nm or less, and a pattern forming method using the positive resist composition.

2. Description of the Related Art

Along with the miniaturization of semiconductor devices, the trend is moving into shorter wavelength of the exposure light source and higher numerical aperture (high NA) of the projection lens. At present, an exposure machine with NA of 0.84 has been developed, where an ArF excimer laser having a wavelength of 193 nm is used as the light source. As commonly well known, these can be expressed by the following formulae:

(Resolving power)=$k_1 \cdot (\lambda/NA)$ (Focal depth)=$\pm k_2 \lambda/NA^2$ wherein $\lambda$ is the wavelength of the exposure light source, NA is the numerical aperture of the projection lens, and $k_1$ and $k_2$ are constants related to the process.

In order to realize still shorter wavelength and higher resolving power, studies are being made on an exposure machine where an $F_2$ excimer laser having a wavelength of 157 nm is used as the light source. However, the lens material used for the exposure apparatus so as to realize shorter wavelength and the material used for the resist are very limited and therefore, it is extremely difficult to stabilize the production cost or quality of the apparatus and materials. This may lead to a failure in procuring the exposure apparatus or resist assured of sufficiently high performance and stability within a required time period.

Conventionally, a so-called immersion method of filling a high refractive-index liquid (hereinafter sometimes referred to as an "immersion liquid") between the projection lens and the sample has been known as a technique of increasing the resolving power in an optical microscope.

As for the "effect of immersion", assuming that the wavelength of exposure light in air is $\lambda_0$, the refractive index of the immersion liquid to air is n, the convergence half-angle of beam is $\theta$ and $NA_0 = \sin \theta$, the above-described resolving power and focal depth when immersed can be expressed by the following formulae:

(Resolving power)=$k_1 \cdot (\lambda_0/n)/NA_0$ (Focal depth)=$\pm k_2 \cdot (\lambda_0/n)/NA_0^2$ That is, the effect of immersion is equal to use of an exposure wavelength of 1/n. In other words, in the case of a projection optical system with the same NA, the focal depth can be made n times larger by the immersion. This is effective for all pattern profiles and can be combined with super-resolution techniques such as phase-shift method and modified illumination method which are being studied at present.

Examples of the apparatus where this effect is applied to the transfer of a fine image pattern of a semiconductor device are described in JP-A-57-153433 (the term "JP-A" as used herein means an "unexamined published Japanese patent application") and JP-A-7-220990.

Recent progress of the immersion exposure technique is reported, for example, in SPIE Proc., 4688, 11 (2002), J. Vac. Sci. Tecnol. B, 17 (1999), SPIE Proc., 3999, 2 (2000) and International Publication No. WO2004-077158, pamphlet. In the case of using an ArF excimer laser as the light source, in view of safety on handling as well as transmittance and refractive index at 193 nm, pure water (refractive index at 193 nm: 1.44) is considered to be a most promising immersion liquid. In the case of using an $F_2$ excimer laser as the light source, a fluorine-containing solution is being studied in the light of balance between transmittance and refractive index at 157 nm, but those satisfied in view of environmental safety or refractive index have been not yet found out. Considering the degree of immersion effect and the maturity of resist, the immersion exposure technique is expected to be most soon mounted on an ArF exposure machine.

Since the discovery of a resist for a KrF excimer laser (248 nm), an image forming method called chemical amplification is used as the image forming method for a resist so as to compensate the reduction in the sensitivity due to light absorption. The image forming method, for example, using positive chemical amplification is an image forming method where an acid generator in the exposed area decomposes upon exposure to generate an acid, the acid generated is used as a reaction catalyst in the baking after exposure (PEB: post exposure bake) to convert the alkali-insoluble group into an alkali-soluble group, and the exposed area is removed by an alkali developer.

A resist for an ArF excimer laser (wavelength: 193 nm) using this chemical amplification mechanism is predominating at present, but more improvement is demanded on the profile and pattern collapse.

Also, it is pointed out that when the chemical amplification resist is applied to immersion exposure, the resist layer comes into contact with the immersion liquid at the exposure, as a result, the resist layer deteriorates or a component adversely affecting the immersion liquid bleeds out from the resist layer. International Publication No. WO2004-068242, pamphlet describes a case where when the resist for ArF exposure is dipped in water before and after exposure, the resist performance is changed, and this is indicated as a problem in the immersion exposure.

Furthermore, in the immersion exposure process, when the exposure is performed by using a scanning-type immersion exposure machine, unless the immersion liquid moves following the movement of lens, the exposure speed decreases and this may affect the productivity. In the case where the immersion liquid is water, the resist film is preferably hydrophobic and ensures good followability of water.

SUMMARY OF THE INVENTION

An object of the present invention is to provide a positive resist composition improved in the profile and pattern collapse, and a pattern forming method using the positive resist composition. Another object of the present invention is to provide a positive resist composition suitable for immersion exposure, ensuring that the profile and pattern collapse are not changed at immersion exposure and the followability for water is good, and a pattern forming method using the positive resist composition.

The present invention provides a positive resist composition having the following constructions and a pattern forming method using the positive resist composition. The above-described objects of the present invention can be attained by these composition and method.

(1) A positive resist composition, which comprises:

(A) a resin having a monocyclic or polycyclic alicyclic hydrocarbon structure, of which solubility in an alkali developer increases under an action of an acid;

(B) a compound capable of generating an acid upon irradiation with actinic rays or radiation;

(C) a resin having a repeating unit represented by formula (C); and (D) a solvent, wherein a content of the resin as the component (C) is from 0.1 to 20 mass % based on a solid content of the positive resist composition:

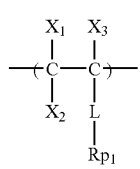

(C)

wherein $X_1$, $X_2$ and $X_3$ each independently represents a hydrogen atom, an alkyl group or a halogen atom;

L represents a single bond or a divalent linking group; and $Rp_1$ represents an acid-decomposable group.

(2) The positive resist composition as described in (1) above, wherein the resin as the component (C) further has a repeating unit represented by formula (C2):

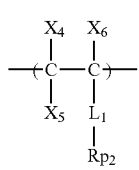

(C2)

wherein $X_4$, $X_5$ and $X_6$ each independently represents a hydrogen atom, an alkyl group or a halogen atom;

$L_1$ represents a single bond or a divalent linking group; and $Rp_2$ represents a non-acid-decomposable group.

(3) The positive resist composition as described in (1) or (2) above, wherein a content of the resin as the component (C) is from 0.1 to 5 mass % based on a solid content of the positive resist composition.

(4) The positive resist composition as described in any of (1) to (3) above, wherein formula (C) is represented by formula (C1):

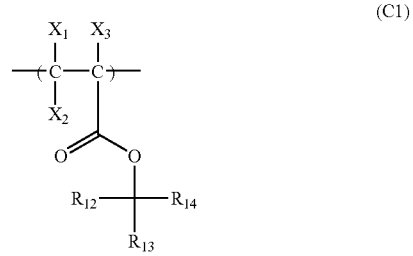

(C1)

wherein $X_1$, $X_2$ and $X_3$ each independently represents a hydrogen atom, an alkyl group or a halogen atom; and $R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring.

(5) The positive resist composition as described in (4) above, wherein in formula (C1), $R_{12}$, $R_{13}$ and $R_{14}$ each independently represents an alkyl group or an alkenyl group and at least one of $R_{12}$, $R_{13}$ and $R_{14}$ represents an alkyl group.

(6) The positive resist composition as described in any of (1) to (5) above, wherein the resin as the component (C) comprises a repeating unit represented by formula (C1) and a repeating unit represented by formula (C2) in a proportion of from 80 to 100 mol % in total repeating units:

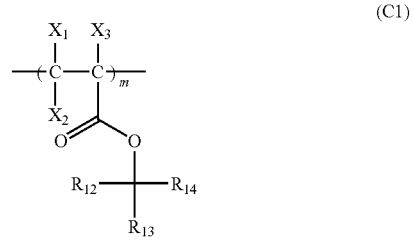

(C1)

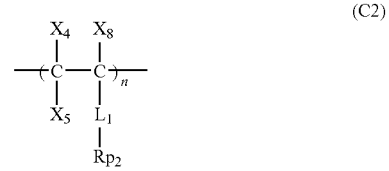

(C2)

wherein $X_1$, $X_2$, $X_3$, $X_4$, $X_5$ and $X_6$ each independently represents a hydrogen atom, an alkyl group or a halogen atom;

$R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring;

$L_1$ represents a single bond or a divalent linking group;

$Rp_2$ represents a non-acid-decomposable group; and m and n each represents a molar ratio of the repeating unit, and m=10 to 100, n=0 to 90 and m+n=100.

(7) The positive resist composition as described in any of (1) to (5) above,
wherein the resin as the component (C) comprises at least one repeating unit selected from formulae (C-I) to (C-IV) in a proportion of from 80 to 100 mol % in total repeating units, provided that the repeating unit represented by formula (C-I) is used in combination with the repeating unit represented by formula (C-II):

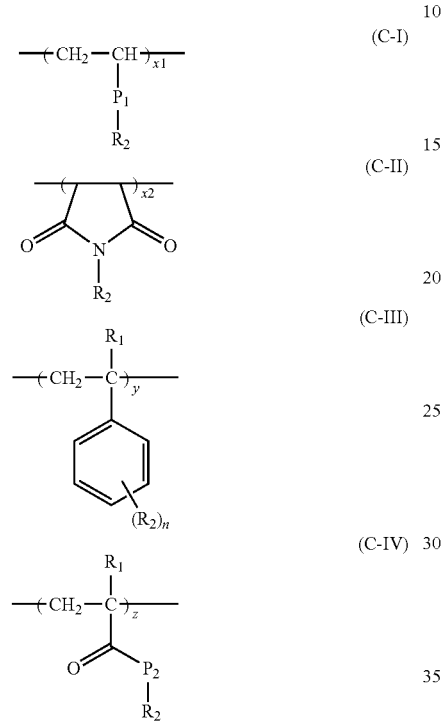

wherein $R_1$ represents a hydrogen atom or a methyl group;
$R_2$ represents a hydrocarbon group having two or more —$CH_3$ partial structures, provided that when a plurality of $R_2$'s are present, the plurality of $R_2$'s may be the same or different;
$P_1$ represents a single bond, an alkylene group or an ether group, or a linking group having two or more thereof;
$P_2$ represents a linking group selected from —O—, —NR— and —$NHSO_2$—, wherein R represents a hydrogen atom or an alkyl group;
x1, x2, y and z represent mol % in total repeating units, and x1 represents a number of 0 to 50, x2 represents a number of 0 to 50, y represents a number of 0 to 100, z represents a number of 0 to 100, provided that x1, x2, y and z satisfy $80 \leq x1+x2+y+z \leq 100$; and
n represents an integer of from 1 to 4.

(8) The positive resist composition as described in any of (1) to (7) above,
wherein the resin (A) contains at least a (meth)acrylate-based repeating unit having a lactone structure and a (meth)acrylate-based repeating unit having an acid-decomposable group.

(9) The positive resist composition as described in any of (1) to (8) above,
wherein the resin as the component (A) has a repeating unit represented by formula (A1), a repeating unit represented by formula (A2) and a repeating unit represented by formula (A3):

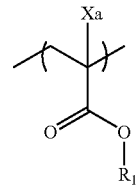

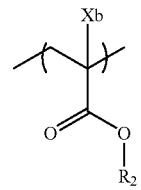

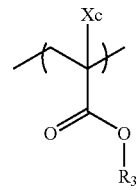

wherein Xa, Xb and Xc each independently represents a hydrogen atom or a methyl group;
$R_1$ represents a monovalent organic group having a lactone structure;
$R_2$ represents a monovalent organic group having a hydroxyl group or a cyano group; and
$R_3$ represents a group capable of being detached under an action of an acid.

(10) A pattern forming method, which comprises:
forming a resist film from a positive resist composition as described in any of (1) to (9) above; and
exposing and developing the resist film.

(11) The pattern forming method as described in (10) above,
wherein the exposure is preformed through an immersion liquid.

Furthermore, preferred embodiments of the present invention are set forth below.

(12) The positive resist composition as described in any of (1) to (9) above,
wherein the compound as the component (B) has a triphenylsulfonium cation structure.

(13) The positive resist composition as described in any of (1) to (9) and (12) above, which further comprises a surfactant.

(14) The positive resist composition as described in any of (1) to (9), (12) and (13) above, which further comprises a basic compound.

(15) The positive resist composition as described in any of (1) to (9) and (12) to (14) above,
wherein the resin (C) has a weight average molecular weight of from 3,000 to 15,000 and a dispersity of from 1.2 to 3.0.

(16) The positive resist composition as described in any of (1) to (9) and (12) to (15) above,
wherein the resin (C) does not have a fluorine atom and a silicon atom.

(17) The positive resist composition as described in any of (4) to (9) and (12) to (16) above, wherein in the resin (C1), $R_{12}$, $R_{13}$ and $R_{14}$ each is an alkyl group, an alkenyl group or a cycloalkyl group, or a group formed by bonding at least two of these groups, and the number of carbon atoms contained in $R_{12}$ to $R_{14}$ is from 6 to 20.

(18) The positive resist composition as described in any of (1) to (9) and (12) to (17) above, wherein the compound (B) is a compound capable of generating a fluorine atom-containing aliphatic sulfonic acid or a fluorine atom-containing benzenesulfonic acid upon irradiation with actinic rays or radiation.

(19) The positive resist composition as described in any of (1) to (9) and (12) to (18) above, wherein the entire solid content concentration in the positive resist composition is from 1.0 to 6.0 mass %.

(20) The pattern forming method as described in (10) or (11) above, wherein the exposure is preformed by exposure to light at a wavelength of from 1 to 200 nm.

DETAILED DESCRIPTION OF THE INVENTION

Figure 1:
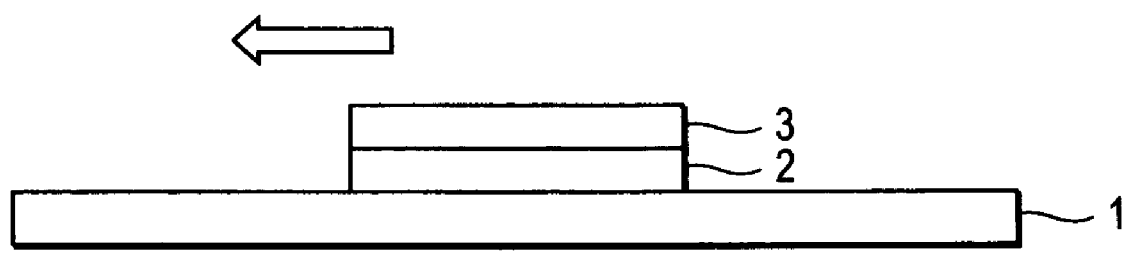
FIG. 1 is a schematic view showing a state on evaluating the followability of water to a quartz plate.

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin Having a Monocyclic or Polycyclic Alicyclic Hydrocarbon Structure, of Which Solubility in an Alkali Developer Increases Under the Action of an Acid The resin for use in the positive resist composition of the present invention is a resin having a monocyclic or polycyclic alicyclic hydrocarbon structure, of which solubility in an alkali developer increases under the action of an acid (acid-decomposable resin), and this is a resin having a group capable of decomposing under the action of an acid to produce an alkali-soluble group (hereinafter sometimes referred to as an "acid-decomposable group") in the main or side chain or both the main and side chains of the resin (hereinafter sometimes referred to as an "alicyclic hydrocarbon-based acid-decomposable resin" or a "resin (A)").

Examples of the alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl) methylene group or a tris(alkylsulfonyl)methylene group.

Among these alkali-soluble groups, preferred are a carboxylic acid group, a fluorinated alcohol group (preferably hexafluoroisopropanol) and a sulfonic acid group.

The acid-decomposable group is preferably a group formed by substituting a hydrogen atom of such an alkali-soluble group by a group which is detached under the action of an acid.

Examples of the group which is detached under the action of an acid (hereinafter sometimes referred to as an "acid-detachable group") include —C($R_{36}$)($R_{37}$)($R_{38}$), —C($R_{36}$)($R_{37}$)(O$R_{39}$) and —C($R_{01}$)($R_{02}$)(O$R_{39}$). In the formulae, $R_{36}$ to $R_{39}$ each independently represents an alkyl group, a cycloalkyl group, an aryl group, an aralkyl group or an alkenyl group, and $R_{36}$ and $R_{37}$ may combine with each other to form a ring. $R_{01}$ and $R_{02}$ each independently represents a hydrogen atom, an alkyl group, a cycloalkyl group, an aryl group, an aralkyl group or an alkenyl group.

Preferred examples of the acid-decomposable group include a cumyl ester group, an enol ester group, an acetal ester group and a tertiary alkyl ester group, with a tertiary alkyl ester group being more preferred.

The resin (A) is preferably a resin containing at least one repeating unit selected from the group consisting of a repeating unit having an alicyclic hydrocarbon-containing partial structure represented by any one of the following formulae (pI) to (pV), and a repeating unit represented by the following formula (II-AB).

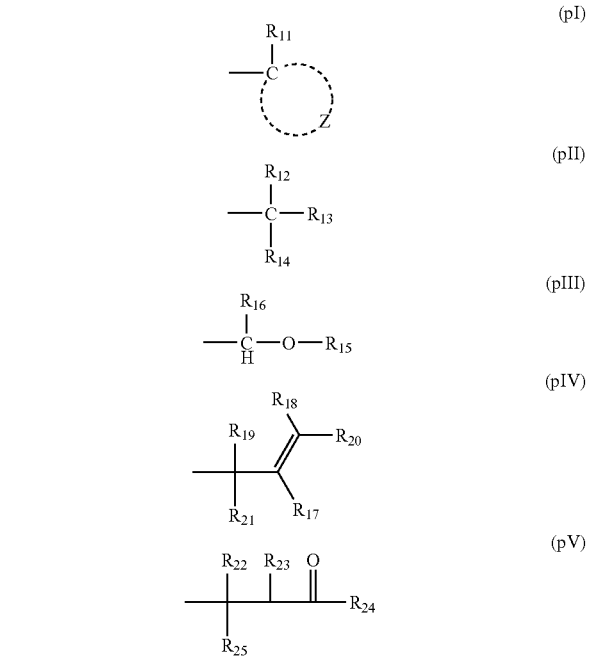

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents an alkyl group or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom, an alkyl group or a cycloalkyl group, provided that at least one of $R_{17}$ to $R_{21}$ represents a cycloalkyl group and that either one of $R_{19}$ and $R_{21}$ represents an alkyl group or a cycloalkyl group.

$R_{22}$ to $R_{25}$ each independently represents a hydrogen atom, an alkyl group or a cycloalkyl group, provided that at least one of $R_{22}$ to $R_{25}$ represents a cycloalkyl group. $R_{23}$ and $R_{24}$ may combine with each other to form a ring.

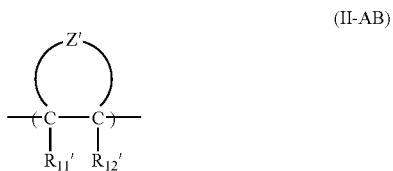
(II-AB)

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C—C).

Formula (II-AB) is preferably the following formula (II-AB1) or (II-AB2):

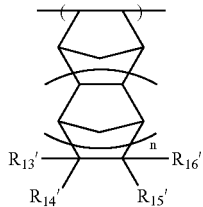
(II-AB1)

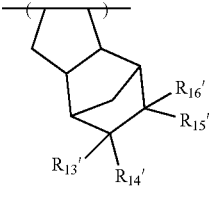
(II-AB2)

In formulae (II-AB1) and (II-AB2), $R_{13}'$ to $R_{16}'$ each independently represents a hydrogen atom, a halogen atom, a cyano group, —COOH, —COOR$_5$, a group capable of decomposing under the action of an acid, —C(=O)—X-A'-$R_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ is preferably a linear or branched alkyl group having a carbon number of 1 to 4, and examples thereof include a methyl group, an ethyl group, an n-propyl group, an isopropyl group, an n-butyl group, an isobutyl group and a sec-butyl group.

The cycloalkyl group of $R_{12}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbomyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbomyl group, a cyclohexyl group, a cyclopentyl group, a tetracyclododecanyl group and a tricyclodecanyl group.

These alkyl and cycloalkyl groups each may further have a substituent, and examples of the substituent include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like may further have include a hydroxyl group, a halogen atom and an alkoxy group.

The structures represented by formulae (pI) to (pV) each can be used for the protection of an alkali-soluble group in the resin.

The repeating unit having an alkali-soluble group protected by the structure represented by any one of formulae (pI) to (pV) is preferably a repeating unit represented by the following formula (pA):

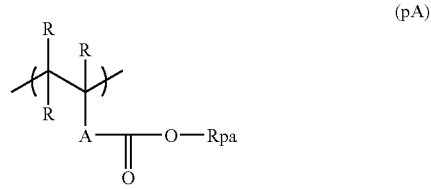
(pA)

In formula (pA), R represents a hydrogen atom, a halogen atom or a linear or branched alkyl group having a carbon number of 1 to 4, and a plurality of R's may be the same or different.

A represents a single bond, a sole group selected from the group consisting of an alkylene group, an ether group, a thioether group, a carbonyl group, an ester group, an amido group, a sulfonamido group, a urethane group and a urea group, or a combination of two or more groups selected therefrom. A is preferably a single bond.

Rpa represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl(meth)acrylate.

Specific examples of the repeating unit represented by formula (pA) are set forth below.

(In the formulae, Rx represents H, CH$_3$, CF$_3$ or CH$_2$OH, and Rxa and Rxb each alkyl group having a carbon number of 1 to 4.)

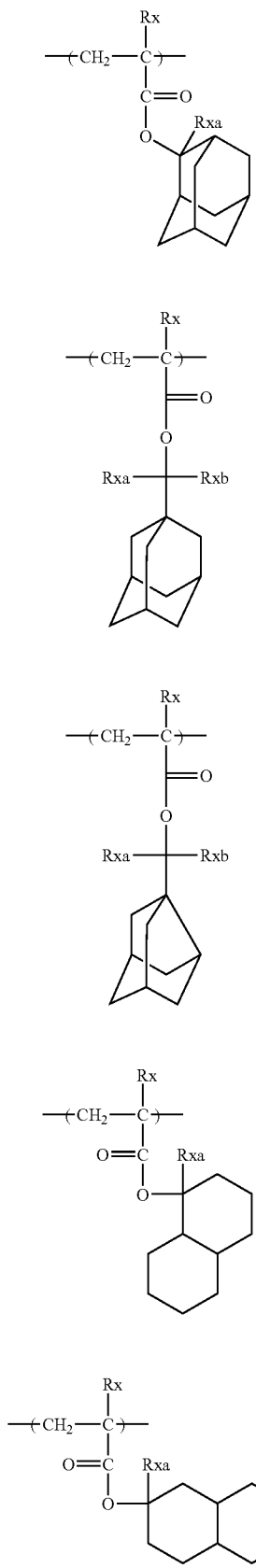
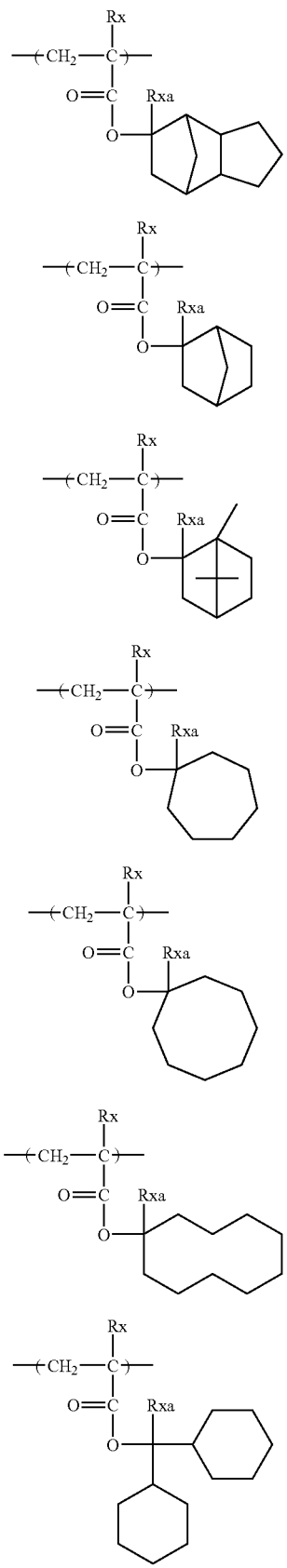

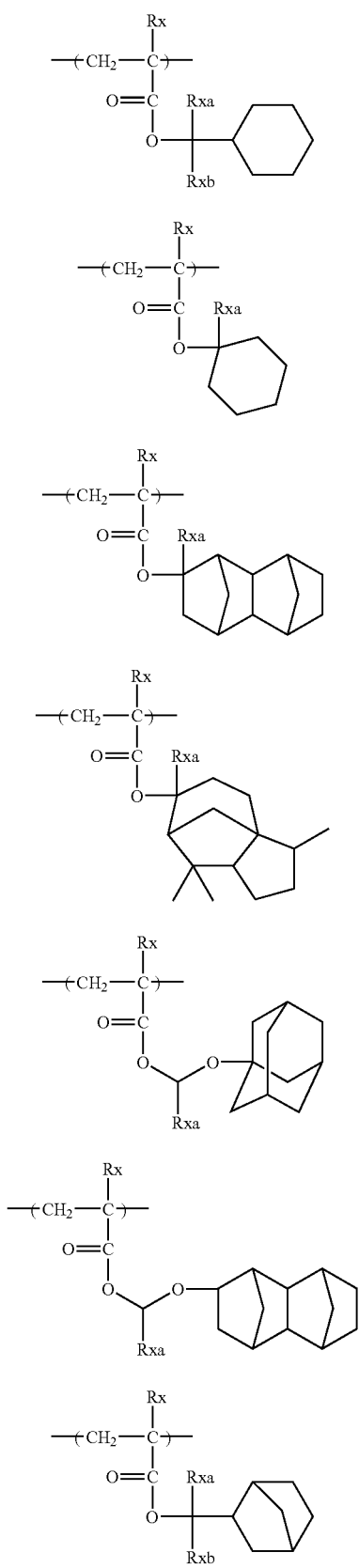
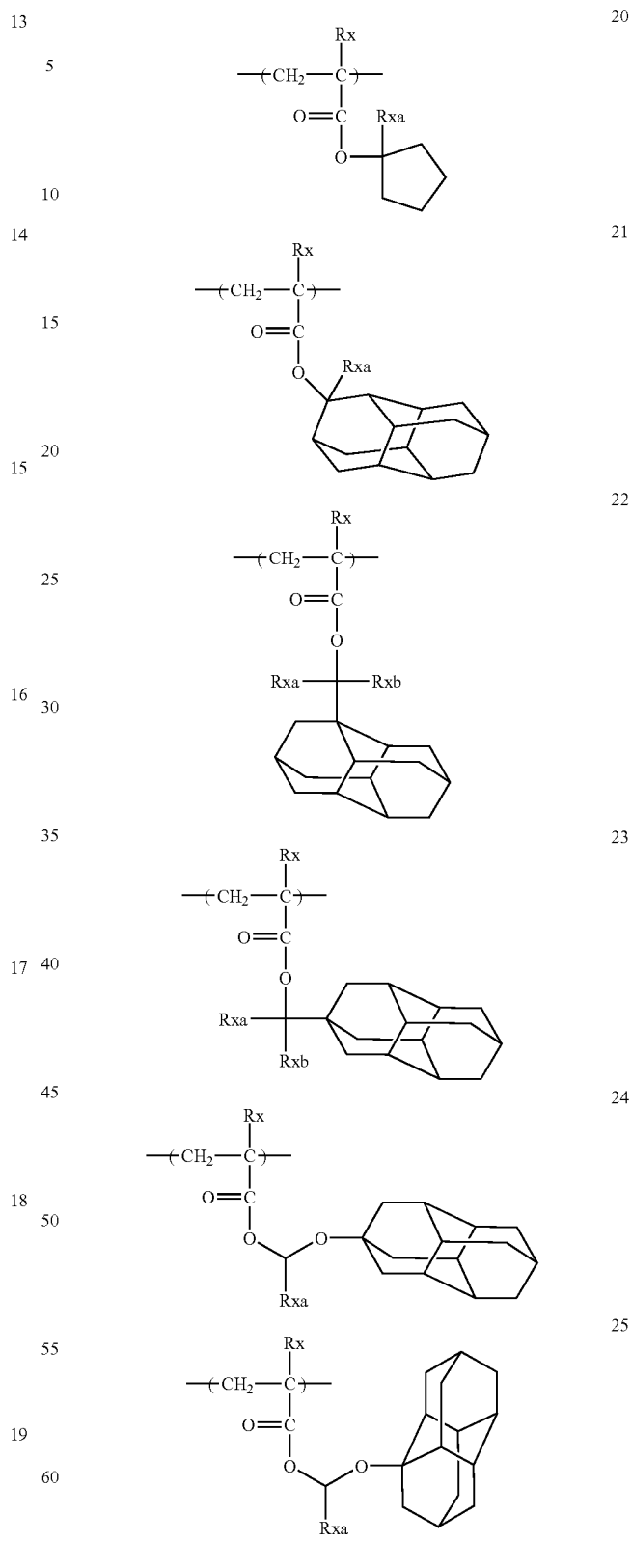
Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$, includes a linear or branched alkyl group having a carbon number of 1 to 10.

The atomic group of Z' for forming an alicyclic structure is an atomic group for forming, in the resin, an alicyclic hydrocarbon repeating unit which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of $R_{12}$ to $R_{25}$ in formulae (pI) to (pVI).

The alicyclic hydrocarbon skeleton may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing under the action of an acid may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may work out to a substituent of an atomic group for forming an alicyclic structure in formula (II-AB) or an atomic group Z' for forming a crosslinked alicyclic structure.

Specific examples of the repeating units represented by formulae (II-AB1) and (II-AB2) are set forth below, but the present invention is not limited to these specific examples.

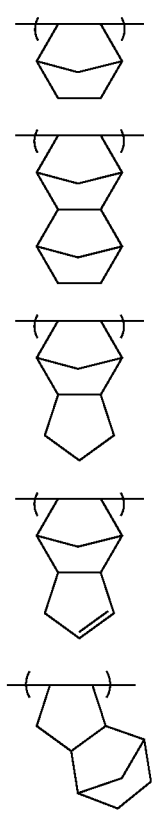

-continued

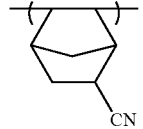
[II-6]

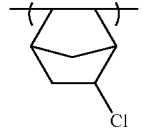
[II-7]

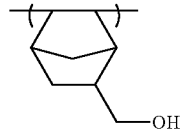
[II-8]

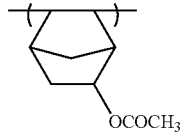
[II-9]

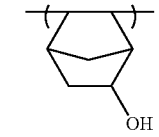
[II-10]

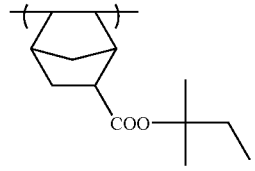
[II-11]

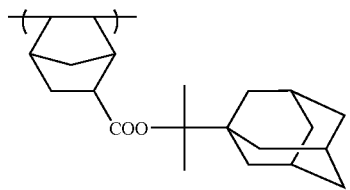
[II-12]

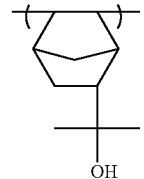
[II-13]

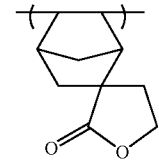
[II-14]

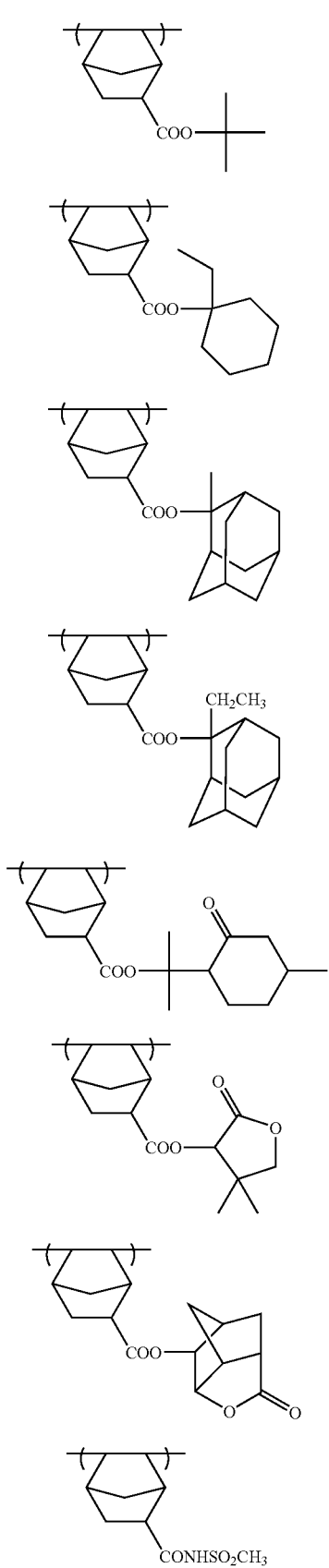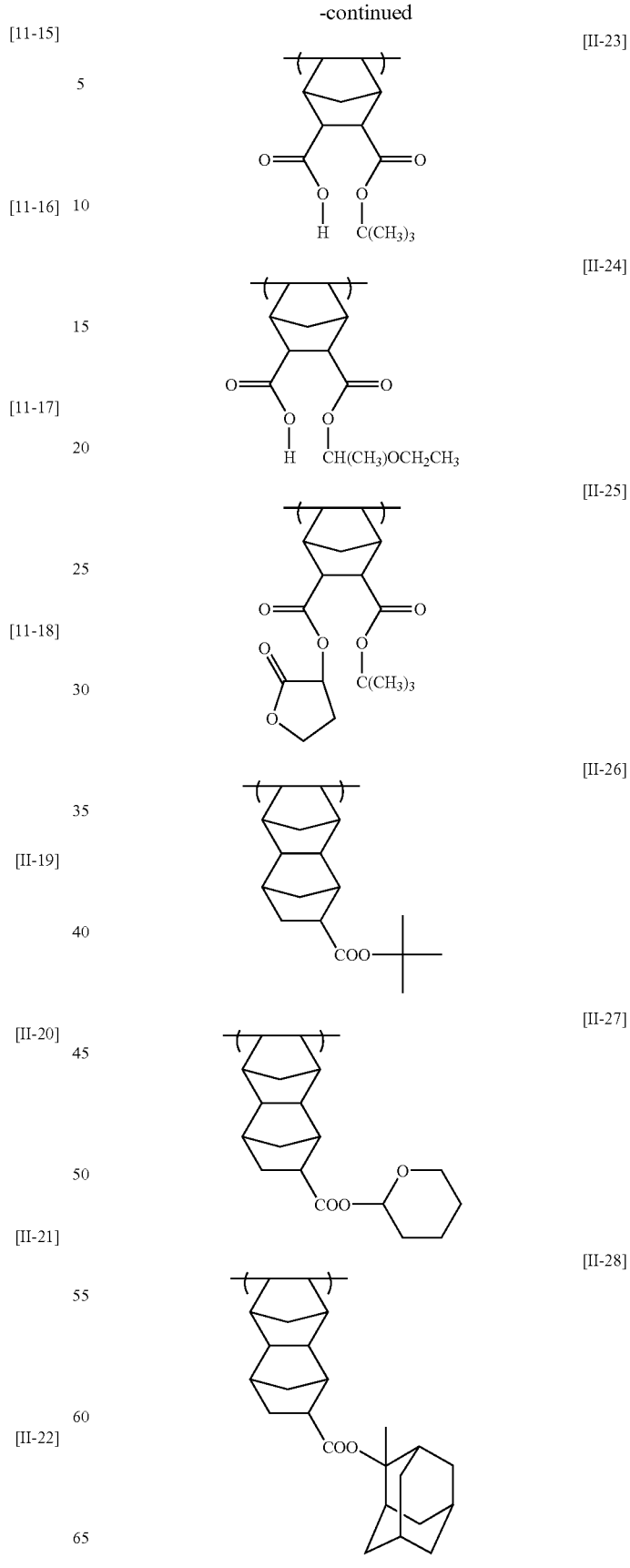

-continued

[II-29]
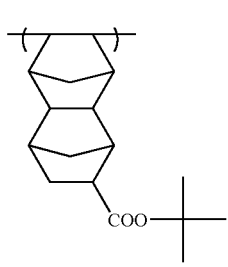

[II-30]
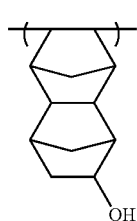

[II-31]
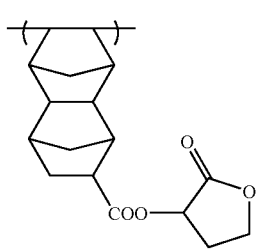

[II-32]
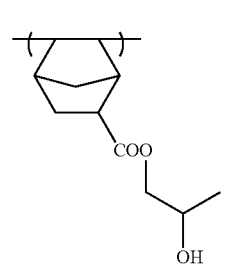

The alicyclic hydrocarbon-based acid-decomposable resin for use in the present invention preferably contains a group having a lactone ring. As for the group having a lactone ring, any group may be used as long as it has a lactone ring, but a group having a 5- to 7-membered ring lactone structure is preferred. The 5- to 7-membered ring lactone structure is preferably condensed with another ring structure in the form of forming a bicyclo or spiro structure. A group having a lactone structure represented by any one of the following formulae (LC1-1) to (LC1-16) is more preferred. The group having a lactone structure may be bonded directly to the main chain. Among these lactone structures, preferred are (LC1-1), (LC1-4), (LC1-5), (LC1-6), (LC1-13) and (LC1-14). By virtue of using a lactone structure, the line edge roughness and development defect are improved.

LC1-1
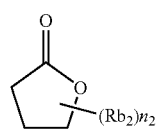

-continued

LC1-2
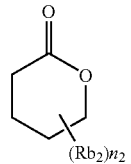

LC1-3
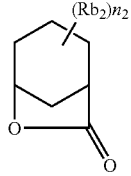

LC1-4
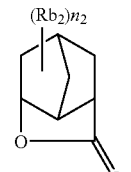

LC1-5
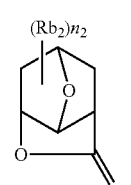

LC1-6
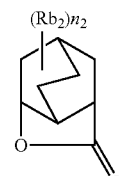

LC1-7
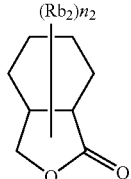

LC1-8
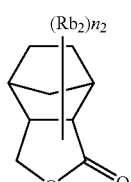

LC1-9
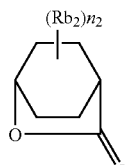

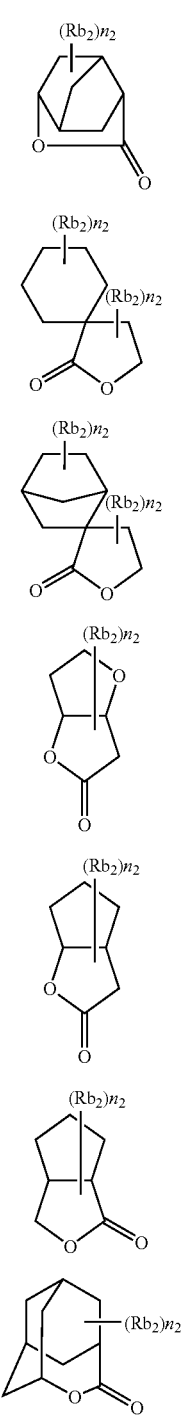

same or different and also, the plurality of $Rb_2$'s may combine with each other to form a ring.

Examples of the repeating unit having a lactone structure represented by any one of formulae (LC1-1) to (LC1-13) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

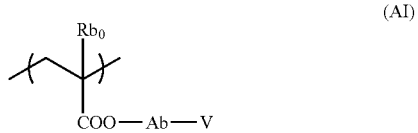

In formula (AI), $Rb_0$ represents a hydrogen atom, a halogen atom or an alkyl group having a carbon number of 1 to 4.

Preferred examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by -$Ab_1$-$CO_2$—. $Ab_1$ is a linear or branched alkylene group or a monocyclic or polycyclic cycloalkylene group, preferably a methylene group, an ethylene group, a cyclohexyl group, an adamantyl group or a norbornyl group.

V represents a group having a lactone structure represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit having a lactone structure-containing group are set forth below, but the present invention is not limited thereto.

(In the formulae, Rx is H, $CH_3$, $CH_2OH$ or $CF_3$.)

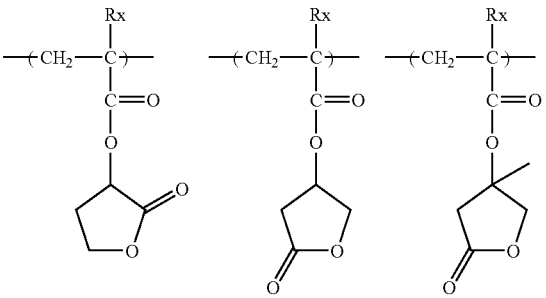

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality Of $Rb_2$'s may be the -continued
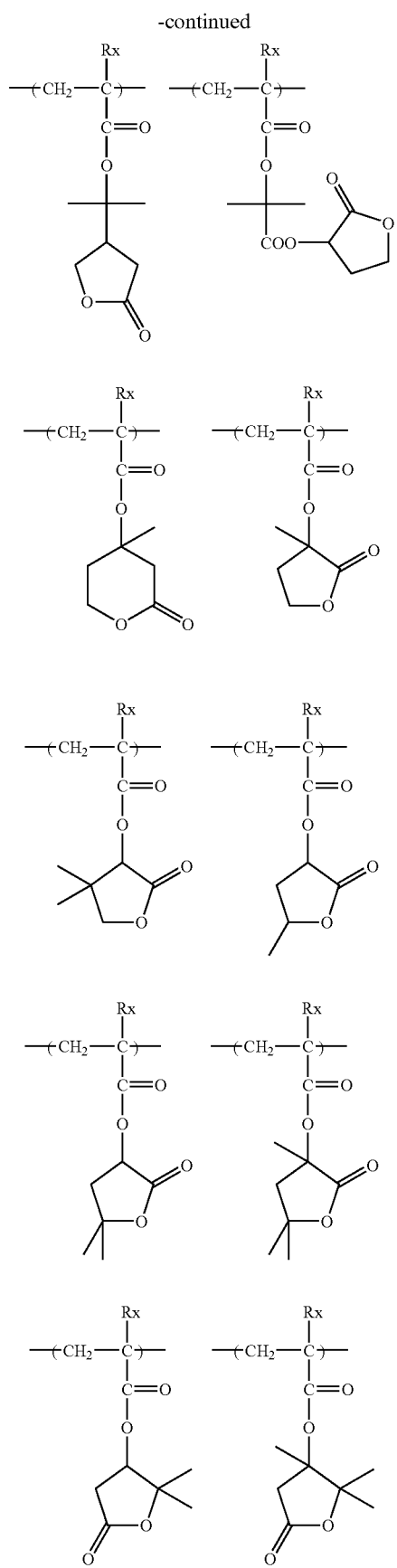
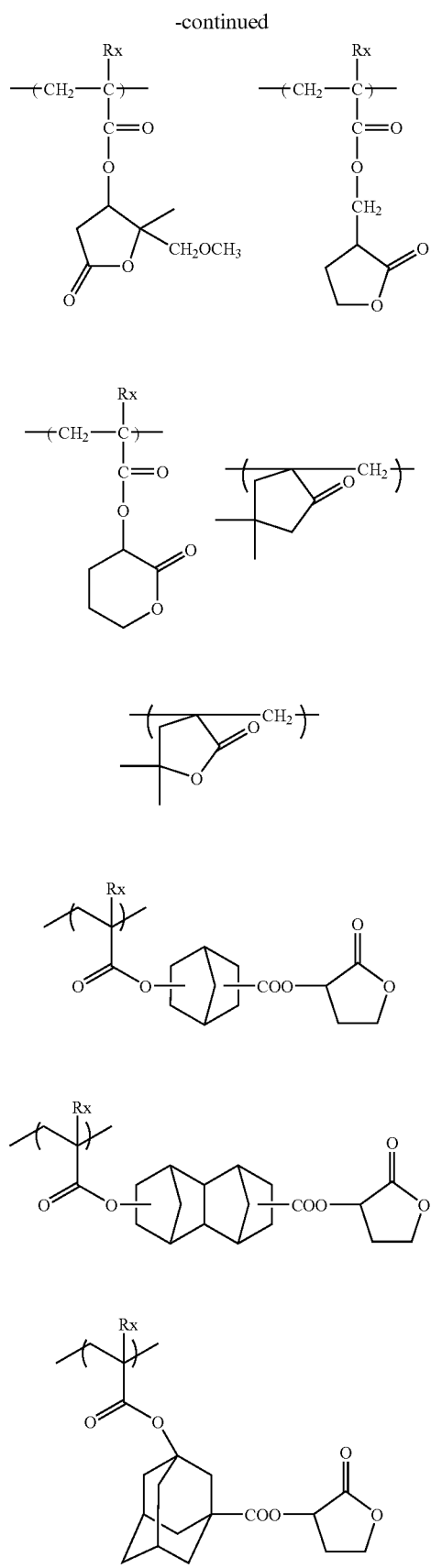

(In the formulae, Rx is H, CH₃, CH₂OH or CF₃.)
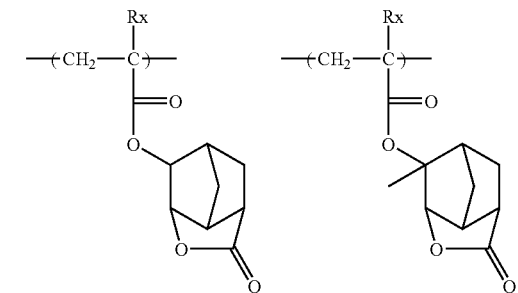
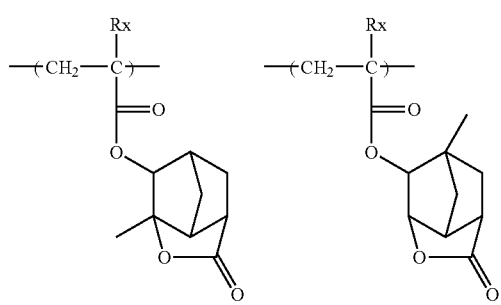
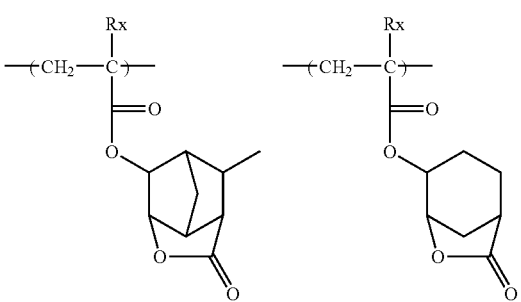
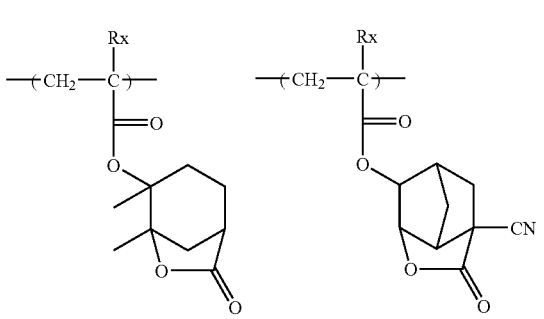
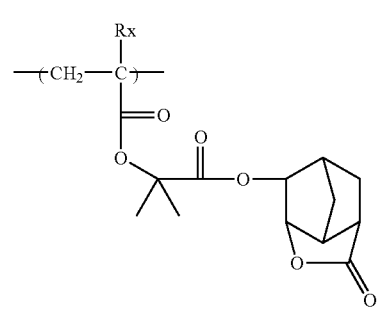
-continued
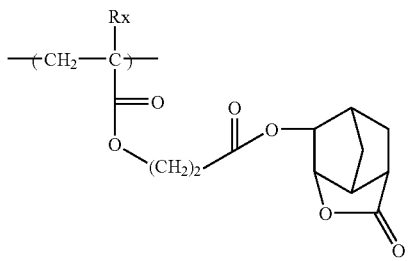
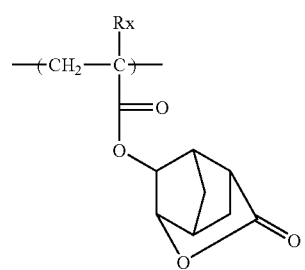
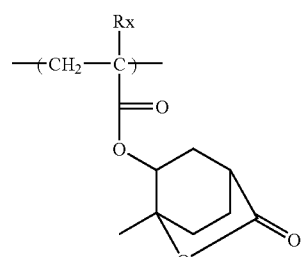
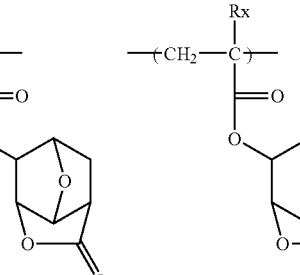
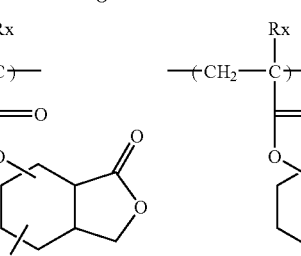
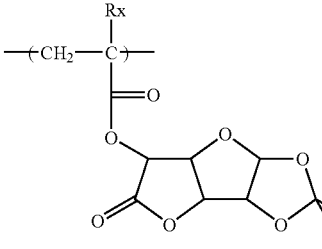

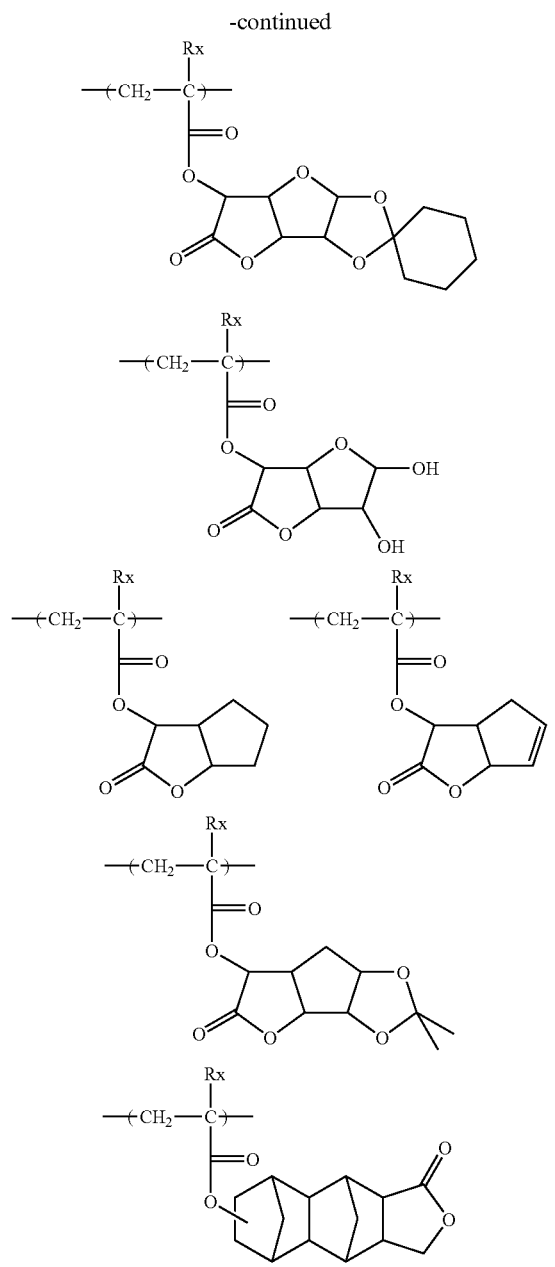
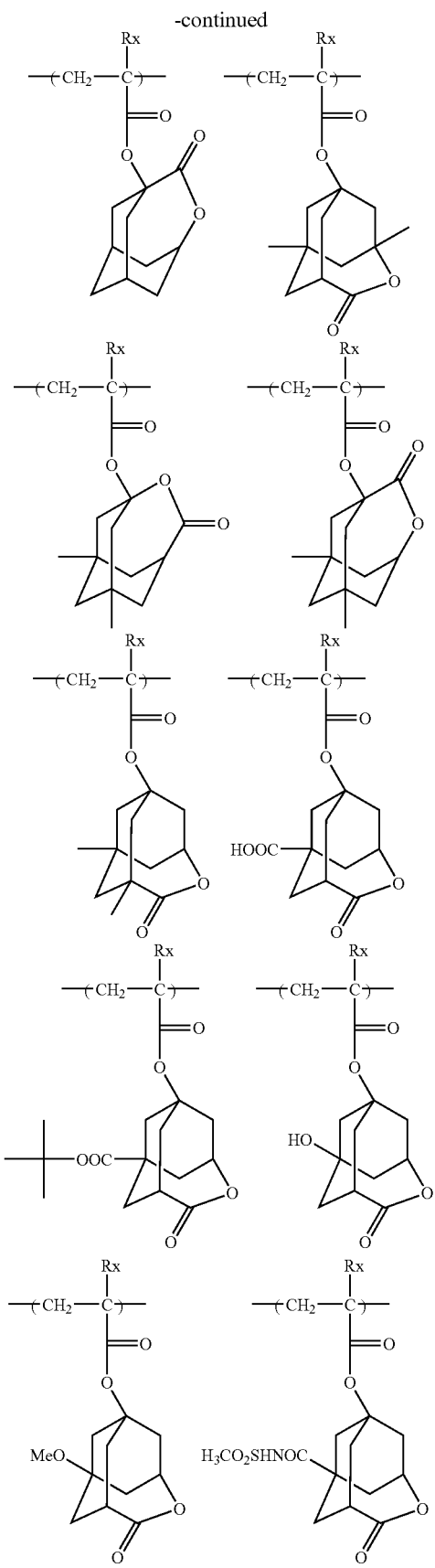
(In the formulae, Rx is H, CH₃, CH₂OH or CF₃.)

The alicyclic hydrocarbon-based acid-decomposable resin for use in the present invention preferably contains a repeating unit having an alicyclic hydrocarbon structure substituted by a polar group. By virtue of this repeating unit, the adhesion to substrate and the affinity for developer are enhanced. The alicyclic hydrocarbon structure of the alicyclic hydrocarbon structure substituted by a polar group is preferably an adamantyl group, a diamantyl group or a norbornane group. The polar group is preferably a hydroxyl group or a cyano group. The alicyclic hydrocarbon structure substituted by a polar group is preferably a partial structure represented by any one of the following formulae (VIIa) to (VIId):

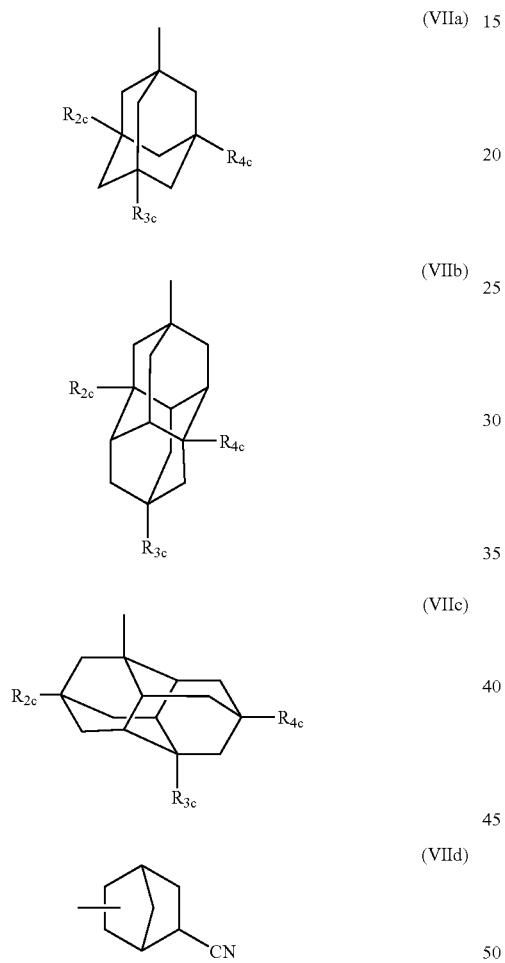

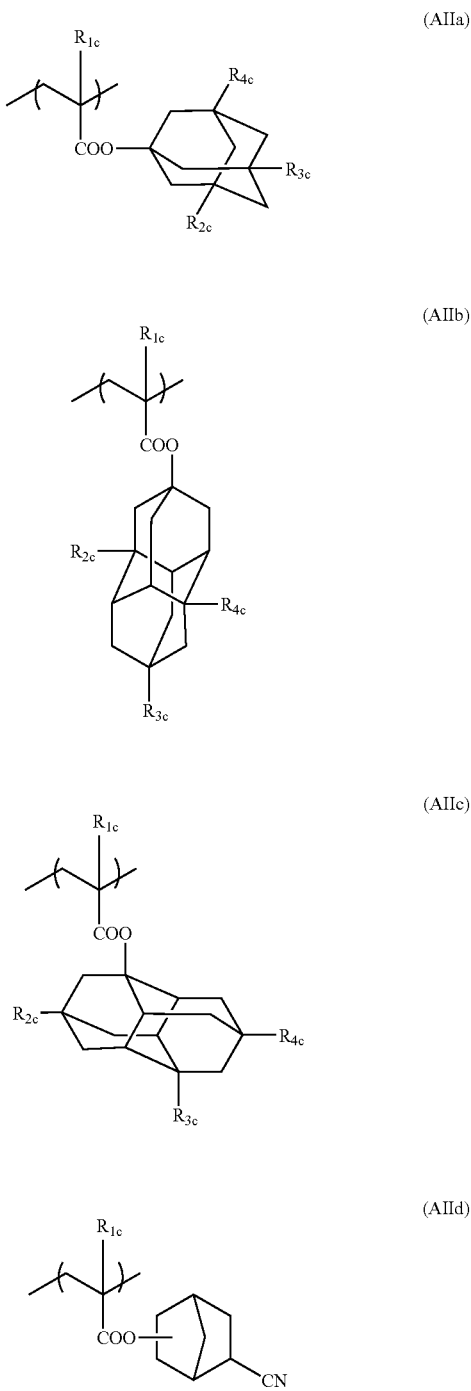

In formulae (VIIa) to (VIIc), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two member(s) out of $R_{2c}$ to $R_{4c}$ is(are) a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

Examples of the repeating unit having a partial structure represented by any one of formulae (VIIa) to (VIId) include a repeating unit where at least one of $R_{13}'$ to $R_{16}'$ in formula (II-AB1) or (II-AB2) is a partial structure represented by any one of formulae (VIIa) to (VIId) (for example, $R_5$ of —COOR$_5$ is a partial structure represented by any one of formulae (VIIa) to (VIId)), and repeating units represented by the following formulae (AIIa) to (AIId):

In formulae (AIIa) to (AIId), $R_{1c}$ represents a hydrogen atom, a methyl group, a trifluoromethyl group or a hydroxymethyl group.

Specific examples of the repeating unit having a partial structure represented by any one of formulae (VIIa) to (VIId) are set forth below, but the present invention is not limited thereto.

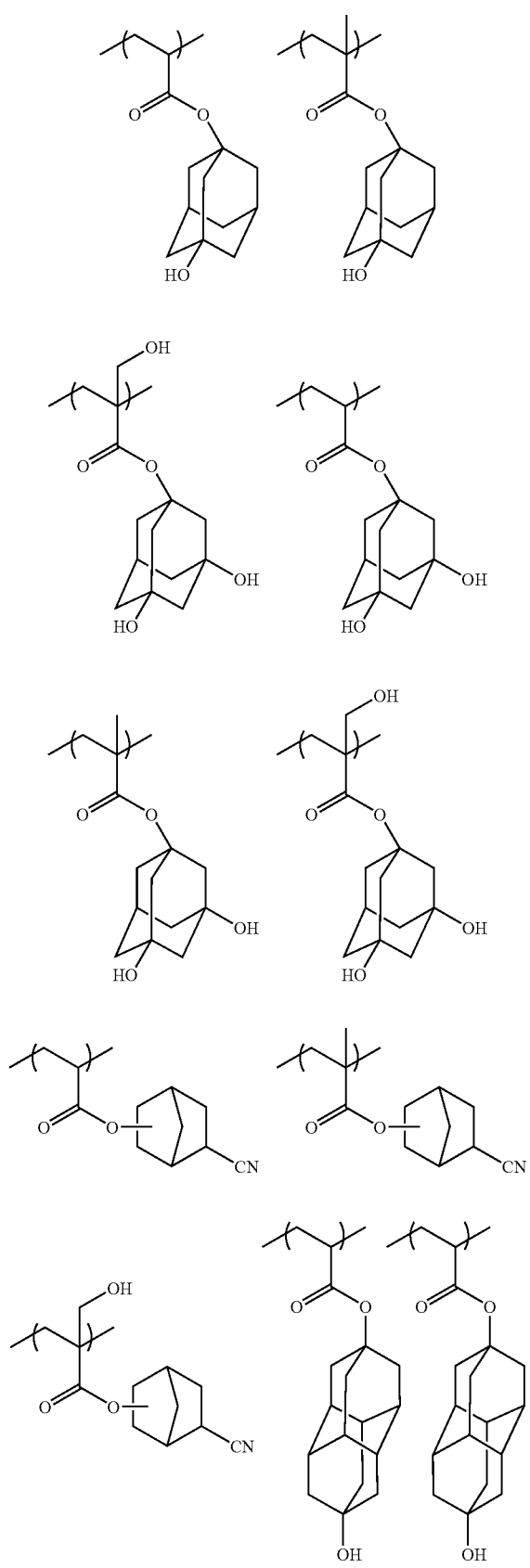

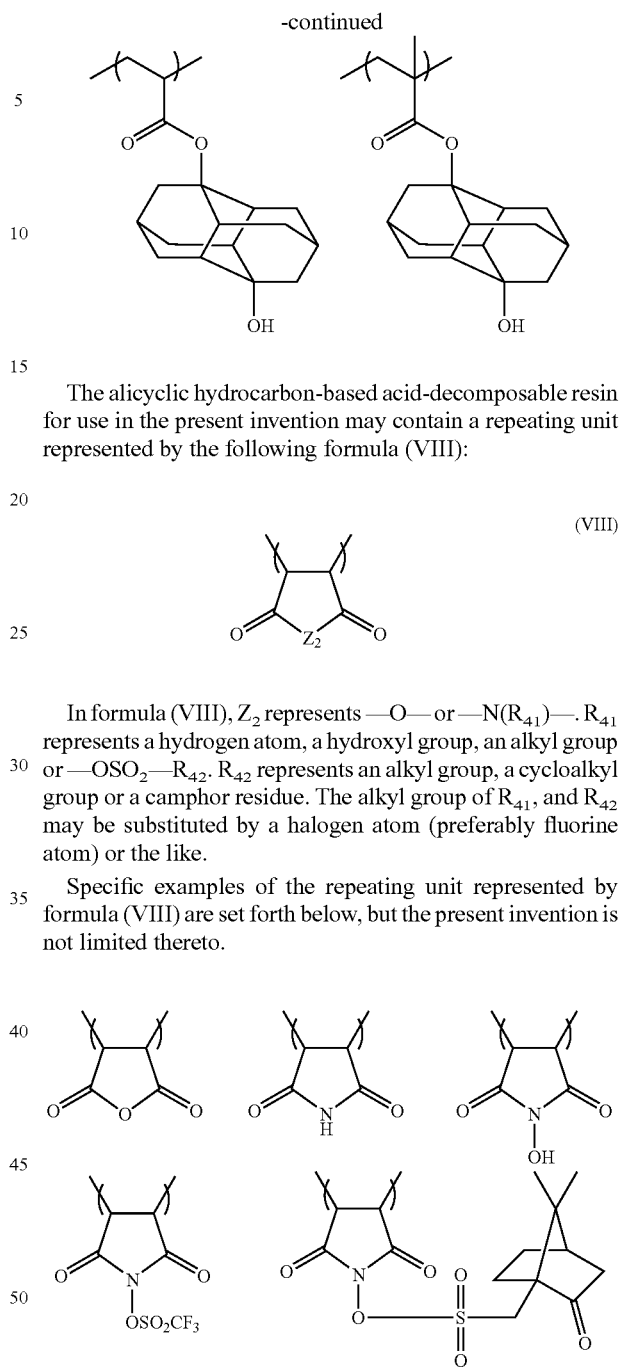

The alicyclic hydrocarbon-based acid-decomposable resin for use in the present invention may contain a repeating unit represented by the following formula (VIII):

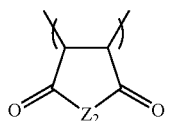

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$, and $R_{42}$ may be substituted by a halogen atom (preferably fluorine atom) or the like.

Specific examples of the repeating unit represented by formula (VIII) are set forth below, but the present invention is not limited thereto.

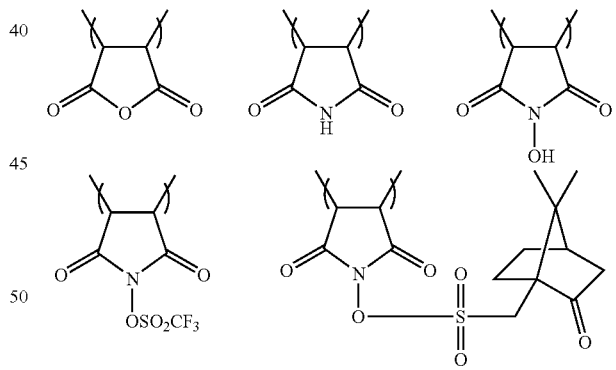

The alicyclic hydrocarbon-based acid-decomposable resin for use in the present invention preferably contains a repeating unit having an alkali-soluble group, more preferably a repeating unit having a carboxyl group. By virtue of containing such a repeating unit, the resolution increases in the usage of forming contact holes. As for the repeating unit having a carboxyl group, both a repeating unit where a carboxyl group is directly bonded to the resin main chain, such as repeating unit by an acrylic acid or a methacrylic acid, and a repeating unit where a carboxyl group is bonded to the resin main chain through a linking group, are preferred. The linking group may have a monocyclic or polycyclic hydrocarbon structure. An acrylic acid and a methacrylic acid are most preferred.

The alicyclic hydrocarbon-based acid-decomposable resin for use in the present invention may further contain a repeating unit having from 1 to 3 groups represented by formula (F1). By virtue of this repeating unit, the line edge roughness performance is enhanced.

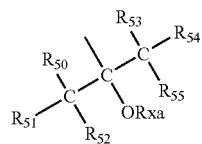

(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rxa represents a hydrogen atom or an organic group (preferably an acid-detachable group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group. It is preferred that $R_{50}$ to $R_{55}$ all are a fluorine atom.

The organic group represented by Rxa is preferably an acid-detachable group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

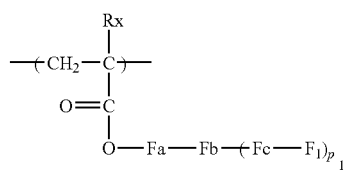

(F2)

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a structure of formula (F1) are set forth below.

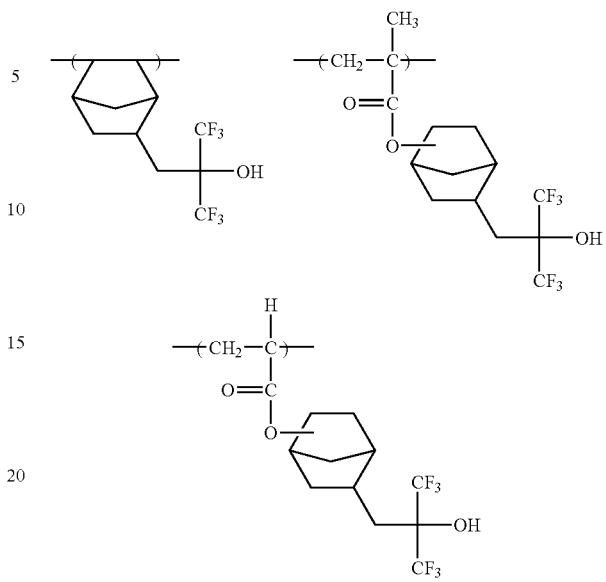

The alicyclic hydrocarbon-based acid-decomposable resin for use in the present invention may contain, in addition to the above-described repeating units, various repeating structural units for the purpose of controlling dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion of unexposed area to substrate, (6) dry etching resistance, and the like can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

As for the repeating structural unit based on the monomer which is the further copolymerization component described above, the content thereof in the resin may also be appropriately determined according to the desired resist performance but in general, the content is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the composition of the present invention for exposure with ArF, the resin preferably has no aromatic group in view of transparency to ArF light.

The alicyclic hydrocarbon-based acid-decomposable resin preferably has a repeating unit represented by the following formula (A1), a repeating unit represented by the following formula (A2) and a repeating unit represented by the following formula (A3):

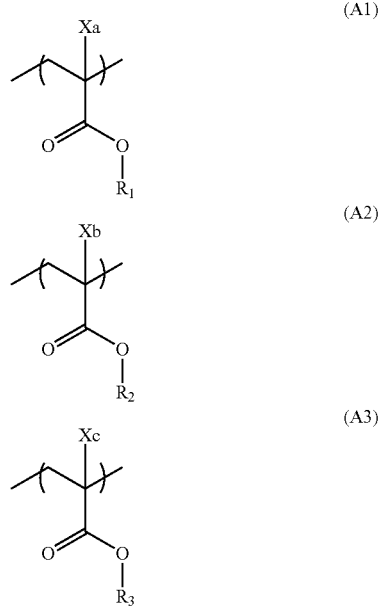

In formulae (A1) to (A3), Xa, Xb and Xc each independently represents a hydrogen atom or a methyl group.

$R_1$ represents a monovalent organic group having a lactone structure.

$R_2$ represents a monovalent organic group having a hydroxyl group or a cyano group.

$R_3$ represents a group which is detached under the action of an acid.

The repeating unit represented by formula (A1) is preferably a repeating unit represented by formula (A1).

The proportion of the repeating unit represented by formula (A1) is preferably from 25 to 50 mol % based on all repeating units in the alicyclic hydrocarbon-based acid-decomposable resin.

The repeating unit represented by formula (A2) is preferably a repeating unit represented by formula (AIIa) or (AIIb).

The proportion of the repeating unit represented by formula (A2) is preferably from 5 to 30 mol % based on all repeating units in the alicyclic hydrocarbon-based acid-decomposable resin.

The repeating unit represented by formula (A3) is preferably a repeating unit represented by formula (pA).

The proportion of the repeating unit represented by formula (A3) is preferably from 25 to 50 mol % based on all repeating units in the alicyclic hydrocarbon-based acid-decomposable resin.

The alicyclic hydrocarbon-based acid-decomposable resin for use in the present invention is preferably a resin where all repeating units are composed of a repeating unit by a (meth) acrylate. In this case, any of a resin where the repeating units all are a repeating unit by a methacrylate, a resin where the repeating units all are a repeating unit by an acrylate, and a resin where the repeating units are a repeating unit by a methacrylate/acrylate mixture may be used, but the content of the repeating unit by an acrylate is preferably 50 mol % or less based on all repeating units. The alicyclic hydrocarbon-based acid-decomposable resin is more preferably a ternary copolymerization polymer comprising from 20 to 50 mol % of the repeating unit having an alicyclic hydrocarbon-containing partial structure represented by any one of formulae (pI) to (pV), from 20 to 50 mol % of the repeating unit having a lactone structure and from 5 to 30 mol % of the repeating unit having an alicyclic hydrocarbon structure substituted by a polar group, or a quaternary copolymerization polymer further comprising from 0 to 20 mol % of other repeating units.

In particular, the resin is preferably a ternary copolymerization polymer comprising from 20 to 50 mol % of the repeating unit having an acid-decomposable group represented by any one of the following formulae (ARA-1) to (ARA-5), from 20 to 50 mol % of the repeating unit having a lactone group represented by any one of the following formulae (ARL-1) to (ARL-6), and from 5 to 30 mol % of the repeating unit having an alicyclic hydrocarbon structure substituted by a polar group represented by any one of the following formulae (ARH-1) to (ARH-3), or a quaternary copolymerization polymer further comprising from 5 to 20 mol % of the repeating unit containing a carboxyl group or a structure represented by formula (F1), or the repeating unit having an alicyclic hydrocarbon structure and not exhibiting acid decomposability.

(In the formulae, $Rxy_1$ represents a hydrogen atom or a methyl group, and $Rxa_1$ and $Rxb_1$ each independently represents a methyl group or an ethyl group).

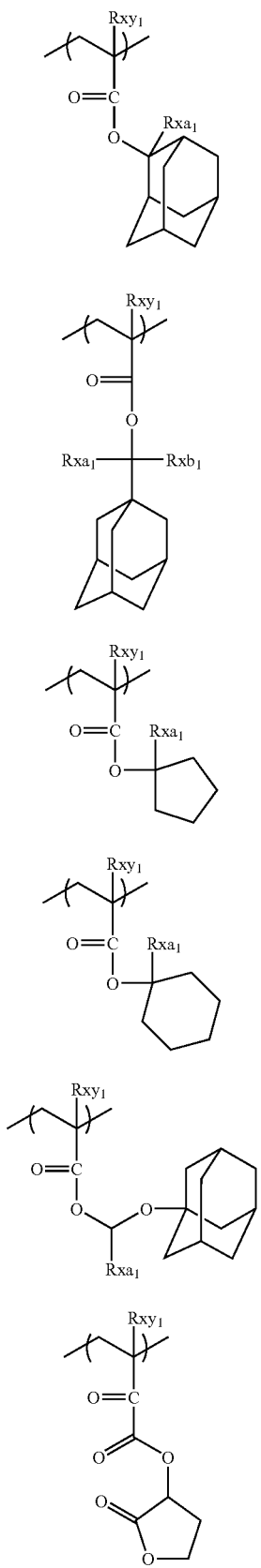
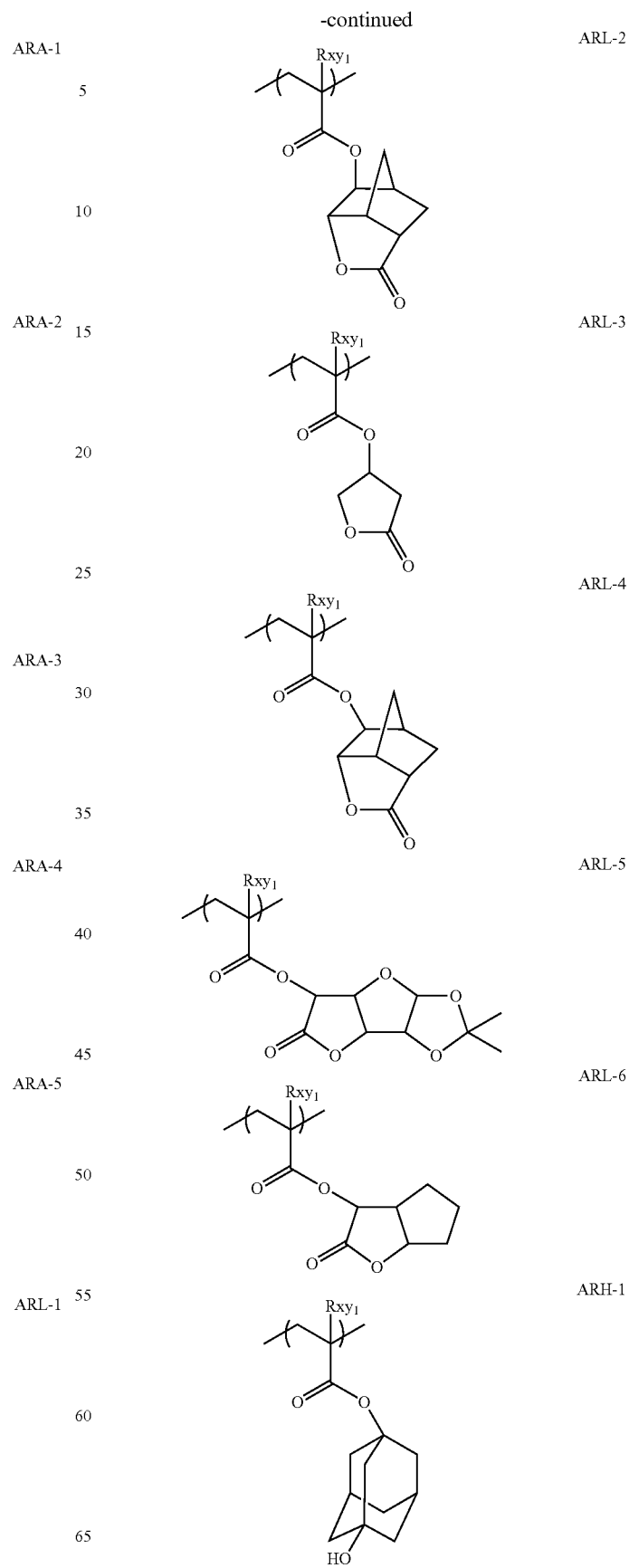

-continued

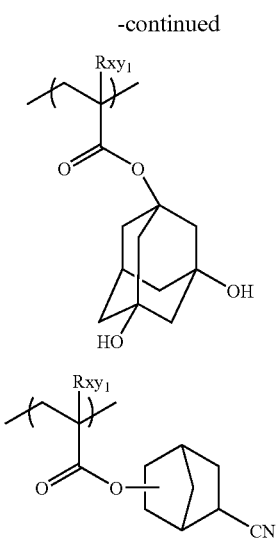

ARH-2

ARH-3

The weight average molecular weight of the alicyclic hydrocarbon-based acid-decomposable resin for use in the present invention is preferably from 1,500 to 100,000, more preferably from 2,000 to 70,000, still more preferably from 3,000 to 50,000. The dispersity (Mw/Mn) of the alicyclic hydrocarbon-based acid-decomposable resin for use in the present invention is preferably from 1.0 to 3.0, more preferably from 1.2 to 2.5, still more preferably from 1.2 to 1.6.

In view of compatibility with the resin (C), the alicyclic hydrocarbon-based acid-decomposable resin of the present invention preferably contains no fluorine atom and no silicon atom.

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is preferably performed by using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C. (In this specification, mass ratio is equal to weight ratio.)

In the present invention, the amount of the resin (A) added in the photosensitive composition is from 50 to 99.7 mass %, preferably from 70 to 99.5 mass %, based on the entire solid content. In addition to the above-described resin for use in the present invention, other resins may also be used, if desired. In the composition of the present invention, the other resin may be mixed at a ratio of preferably 70 parts by mass or less, more preferably 50 parts by mass or less, per 100 parts by mass of the resin (A) for use in the present invention.

[2] (B) Compound Capable of Generating an Acid Upon Irradiation with Actinic Rays or Radiation The positive resist composition of the present invention comprises a compound capable of generating an acid upon irradiation with actinic rays or radiation (hereinafter sometimes referred to as an "acid generator").

The acid generator may be appropriately selected from a photoinitiator for photocationic polymerization, a photoinitiator for photoradical polymerization, a photo-decoloring agent for coloring matters, a photo-discoloring agent, a known compound capable of generating an acid upon irradiation with actinic rays or radiation, which is used for microresist or the like, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of decomposing upon irradiation with actinic rays or radiation to generate an acid, preferred compounds include compounds represented by the following formulae (ZI), (ZII) and (ZIII):

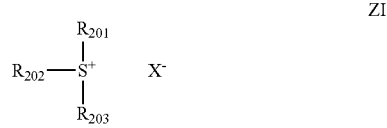

ZI

ZII

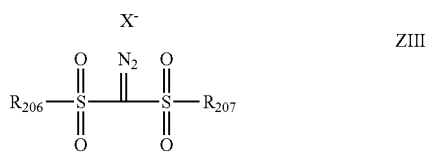

ZIII

In formula (ZI), $R_{201}$, $R_{202}$ and $R_{203}$ each independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes the organic anions represented by the following formulae:

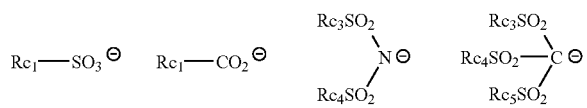

In the formulae, $Rc_1$ represents an organic group.

The organic group of $Rc_1$ includes an organic group having a carbon number of 1 to 30, and preferred examples thereof include an alkyl group, an aryl group, and a group where a plurality of such groups are connected through a single bond or a linking group such as —O—, —$CO_2$—, —S—, —$SO_3$— and —$SO_2N(Rd_1)$—. $Rd_1$ represents a hydrogen atom or an alkyl group.

$Rc_3$, $Rc_4$ and $RC_5$ each independently represents an organic group. Preferred organic groups of $Rc_3$, $Rc_4$ and $Rc_5$ are the same as the preferred organic groups in $Rb_1$. In particular, the organic group is preferably a perfluoroalkyl group having a carbon number of 1 to 4.

$Rc_3$ and $Rc_4$ may combine to form a ring. The group formed by combining $Rc_3$ and $Rc_4$ includes an alkylene group and an arylene group, and a perfluoroalkylene group having a carbon number of 2 to 4 is preferred.

The organic group of $Rc_1$ and $Rc_3$ to $Rc_5$ is in particular preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light increases and the sensitivity is enhanced. Also, when $Rc_3$ and $Rc_4$ are combined to form a ring, the acidity of the acid generated upon irradiation with light increases and the sensitivity is enhanced.

The carbon number of the organic group as $R_{201}$, $R_{202}$ and $R_{203}$ in formula (ZI) is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{20}$, to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (Z1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkyl-sulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, and more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{20}I$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and is preferably a linear or branched alkyl group having a carbon number of 1 to 10, and examples thereof include a methyl group, an ethyl group, a propyl group, a butyl group and a pentyl group. The alkyl group as $R_{201}$ to $R_{203}$ is more preferably a linear or branched 2-oxoalkyl group or an alkoxycarbonylmethyl group.

The cycloalkyl group as $R_{201}$ to $R_{203}$ is preferably a cycloalkyl group having a carbon number of 3 to 10, and examples thereof include a cyclopentyl group, a cyclohexyl group and a norbornyl group. The cycloalkyl group as $R_{201}$ to $R_{203}$ is more preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group.

The alkoxy group in the alkoxycarbonylmethyl group as $R_{201}$ to $R_{203}$ is preferably an alkoxy group having a carbon number of 1 to 5, and examples thereof include a methoxy group, an ethoxy group, a propoxy group, a butoxy group and a pentoxy group.

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

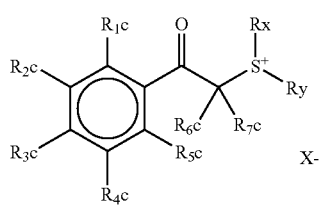

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine with each other to form a ring structure. The ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of the non-nucleophilic anion of $X^-$ in formula (I).

The alkyl group as $R_{1c}$ to $R_{7c}$ may be either linear or branched and is preferably a linear or branched alkyl group having a carbon number of 1 to 20, more preferably a linear or branched alkyl group having a carbon number of 1 to 12, and examples thereof include a methyl group, an ethyl group, a linear or branched propyl group, a linear or branched butyl group, and a linear or branched pentyl group.

The cycloalkyl group as $R_{1c}$ to $R_{7c}$ is preferably a cycloalkyl group having a carbon number of 3 to 20, more preferably a cycloalkyl group having a carbon number of 3 to 8, and examples thereof include a cyclopentyl group and a cyclohexyl group.

The alkoxy group as $R_{1c}$ to $R_{5c}$ may be linear, branched or cyclic and this is, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, and a linear or branched pentoxy group) or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. In this case, the solubility in a solvent is more enhanced, and production of particles during storage can be suppressed.

The alkyl group of $R_x$ and $R_y$ is the same as the alkyl group of $R_{1c}$ to $R_{7c}$. The alkyl group as $R_x$ and $R_y$ is more preferably a linear or branched 2-oxoalkyl group or an alkoxycarbonylmethyl group.

The cycloalkyl group of $R_x$ and $R_y$ is the same as the cycloalkyl group of $R_{1c}$ to $R_{7c}$. The cycloalkyl group as $R_x$ and $R_y$ is more preferably a cyclic 2-oxoalkyl group.

The linear, branched or cyclic 2-oxoalkyl group includes a group having >C=O at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group, an alkyl group or a cycloalkyl group.

The aryl group of $R_{204}$ to $R_{207}$ is preferably a phenyl group or a naphthyl group, more preferably a phenyl group.

The alkyl group of $R_{204}$ to $R_{207}$ may be linear or branched and is preferably a linear or branched alkyl group having a carbon number of 1 to 10, and examples thereof include a methyl group, an ethyl group, a propyl group, a butyl group and a pentyl group.

The cycloalkyl group of $R_{204}$ to $R_{207}$ is preferably a cycloalkyl group having a carbon number of 3 to 10, and examples thereof include a cyclopentyl group, a cyclohexyl group and a norbornyl group.

$R_{204}$ to $R_{207}$ each may have a substituent. Examples of the substituent which $R_{204}$ to $R_{207}$ each may have include an alkyl group (for example, an alkyl group having a carbon number of 1 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion, and examples thereof are the same as those of the non-nucleophilic anion of $X^-$ in formula (I).

Out of the compounds capable of decomposing upon irradiation with actinic rays or radiation to generate an acid, preferred compounds further include the compounds represented by the following formulae (ZIV), (ZV) and (ZVI):

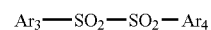

ZIV

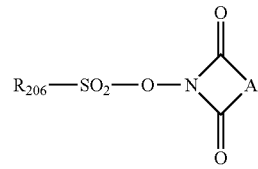

ZV

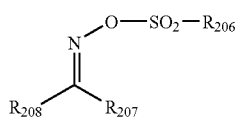

In formulae (ZIV) to (ZVI), $Ar_3$ and $Ar_4$ each independently represents an aryl group.

$R_{206}$ represents an alkyl group, a cycloalkyl group or an aryl group.

$R_{207}$ and $R_{208}$ each independently represents an alkyl group, a cycloalkyl group, an aryl group or an electron-withdrawing group. $R_{207}$ is preferably an aryl group, and $R_{208}$ is preferably an electron-withdrawing group, more preferably a cyano group or a fluoroalkyl group.

A represents an alkylene group, an alkenylene group or an arylene group.

Among the compounds capable of decomposing upon irradiation with actinic rays or radiation to generate an acid, more preferred are compounds represented by formulae (ZI) to (ZIII).

The compound capable of generating an acid upon irradiation with actinic rays or radiation is more preferably a compound having a triphenylsulfonium cation structure.

Particularly preferred examples of the compound capable of decomposing upon irradiation with actinic rays or radiation to generate an acid are set forth below.

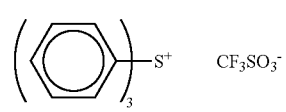

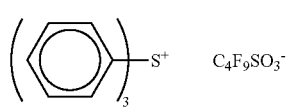

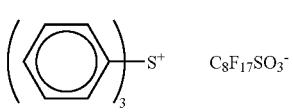

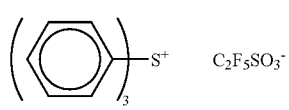

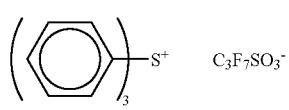

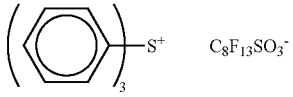

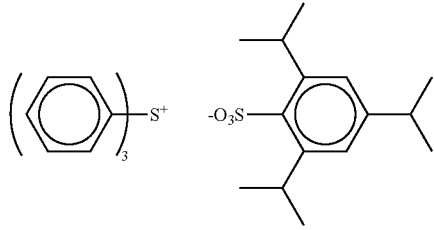

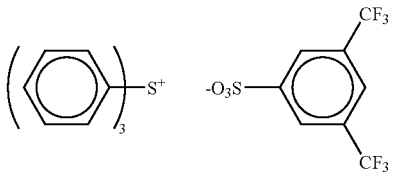

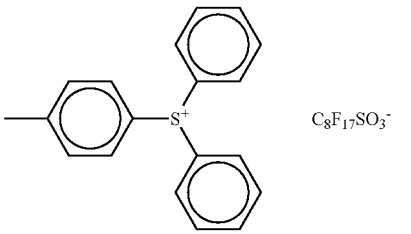

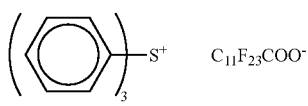

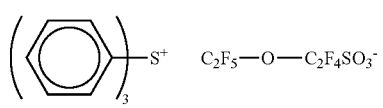

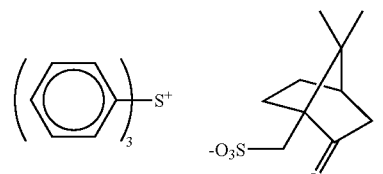

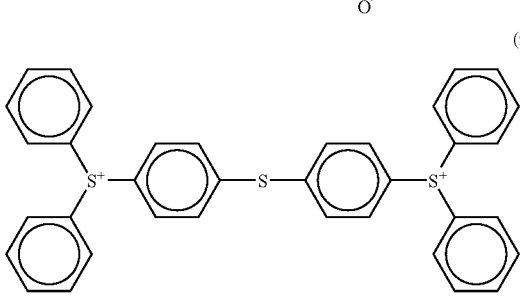

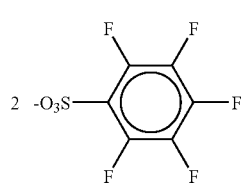

(z14)
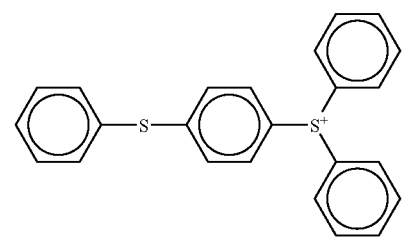
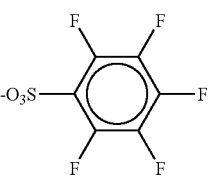
(z15)
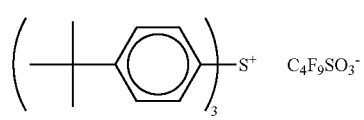
(z16)
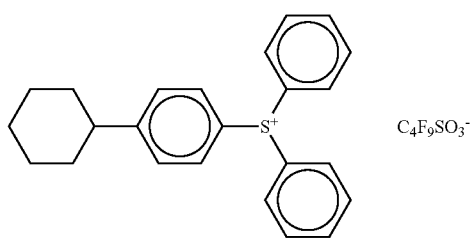
(z17)
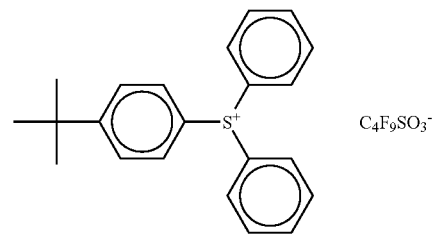
(z18)
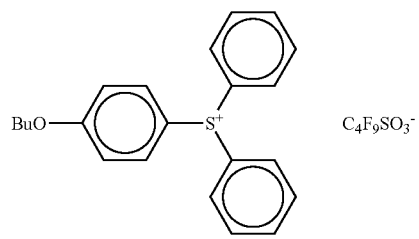
(z19)
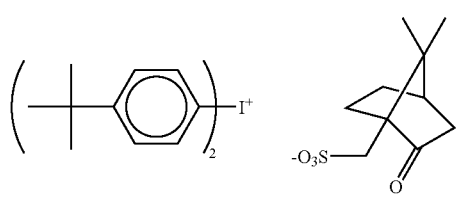
(z20)
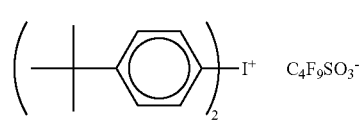
(z21)
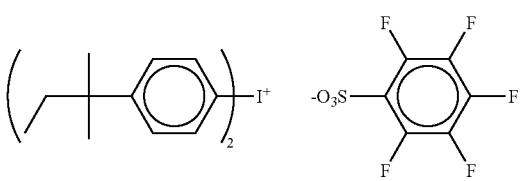
(z22)
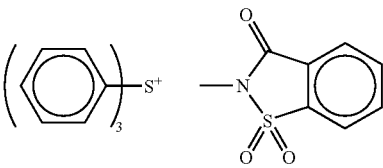
(z23)
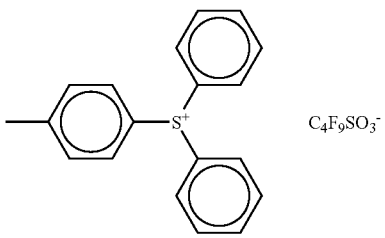
(z24)
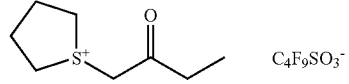
(z25)
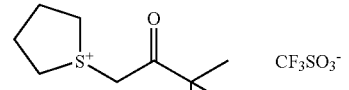
(z26)
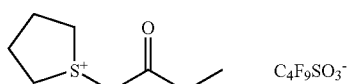
(z27)
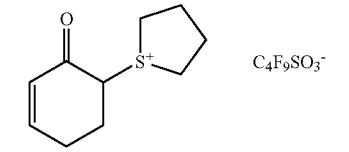
(z28)
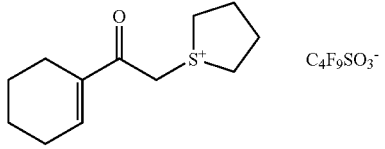
(z29)
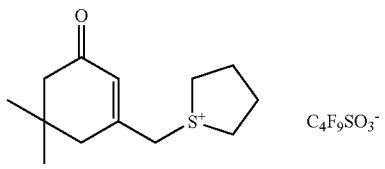

-continued
(z30) 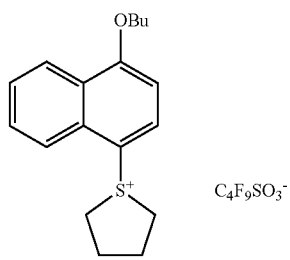
(z31) 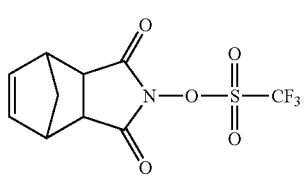
(z32) 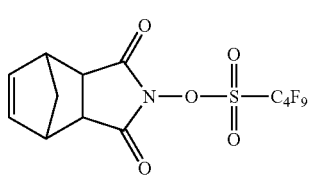
(z33) 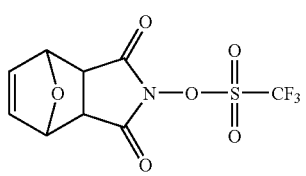
(z34) 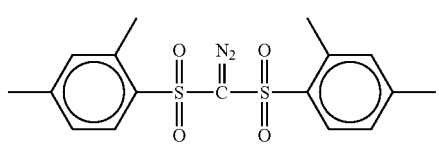
(z35) 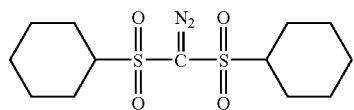
(z36) 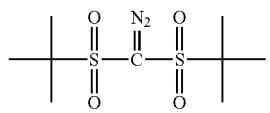
(z37) 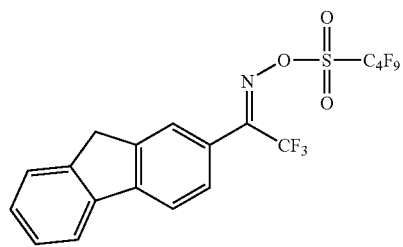
-continued
(z38) 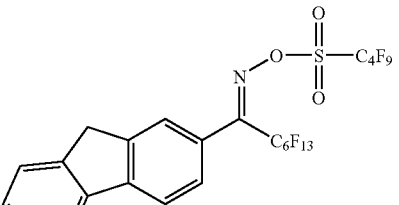
(z39) 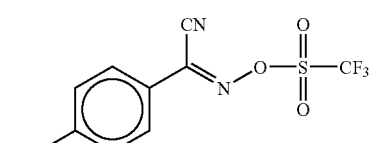
(z40) 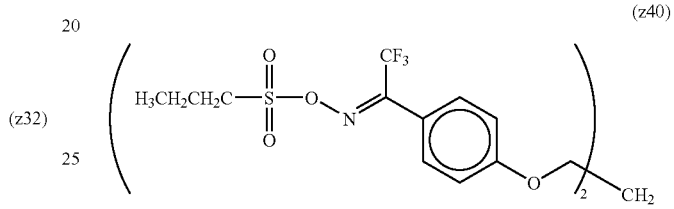
(z41) 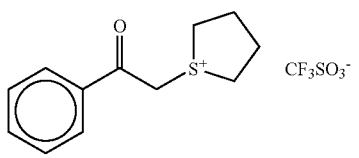
(z42) 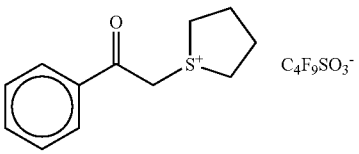
(z43) 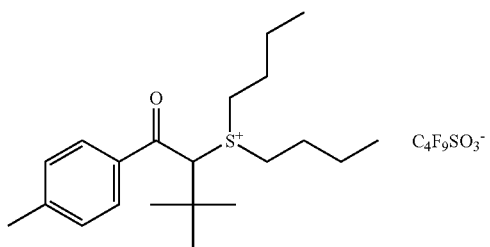
(z44) 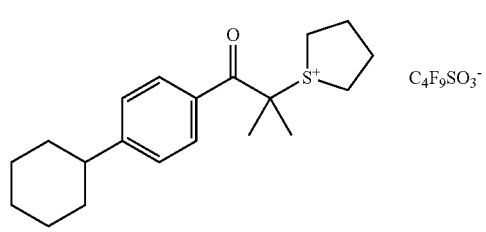
(z45) 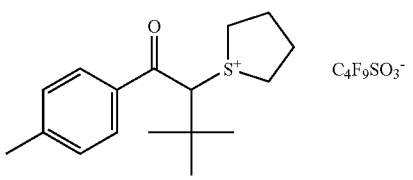

-continued
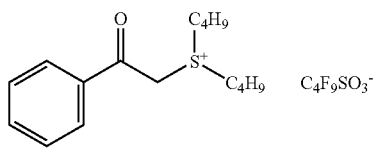 (z46)
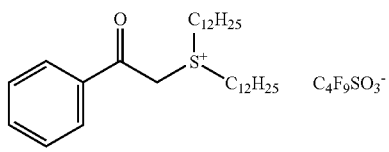 (z47)
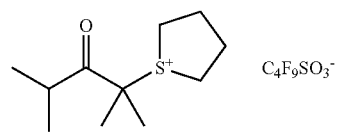 (z48)
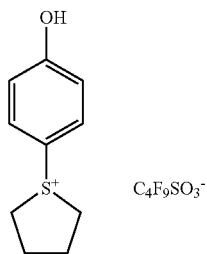 (z49)
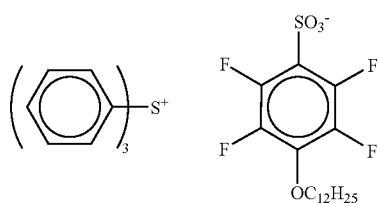 (z50)
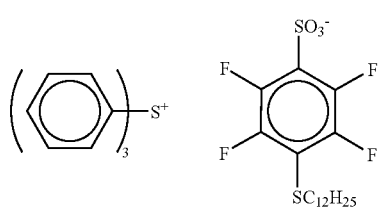 (z51)
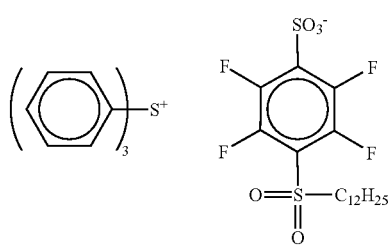 (z52)
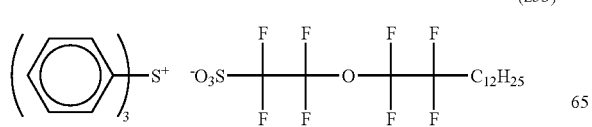 (z53)
-continued
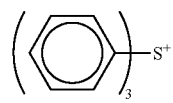 (z54)
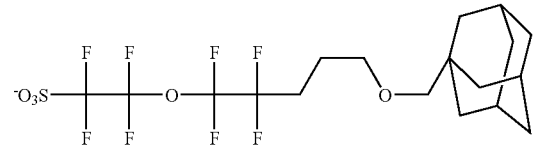 (z55)
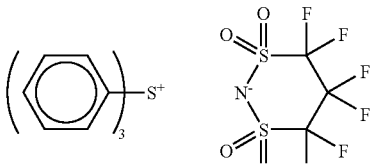 (z55)
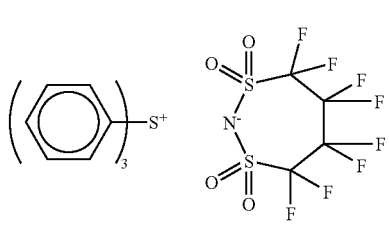 (z56)
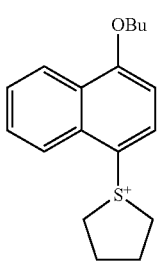 (z57)
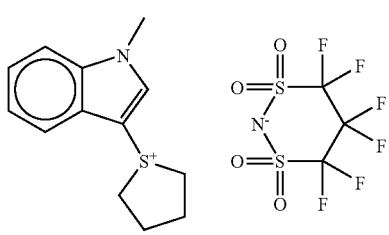 (z58)
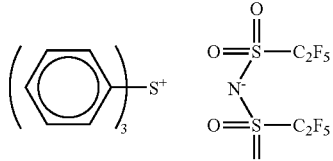 (z59)
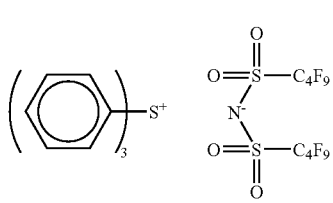 (z60)

(z61) 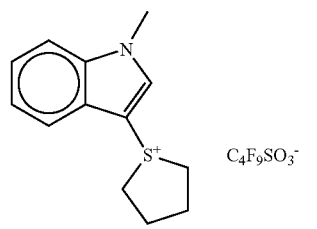
(z62) 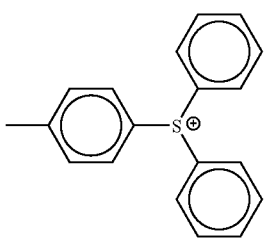
(z63) 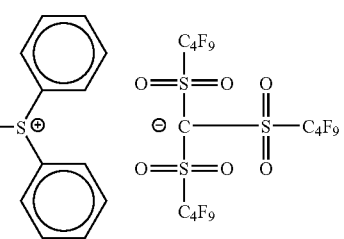
(z64)
(z65)
(z66)
(z67) 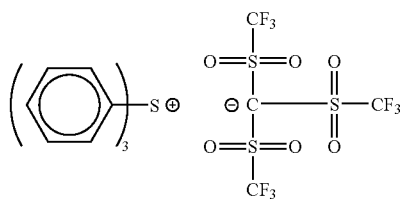
(z68) 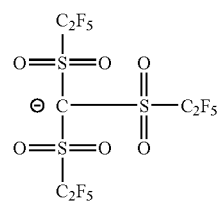
(z69) 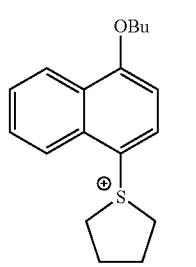 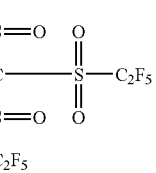
(z70) 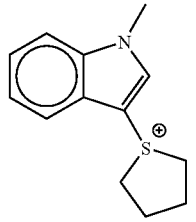 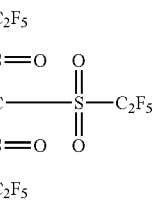
(z71) 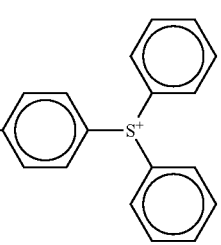 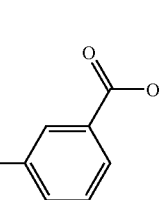
(z72) 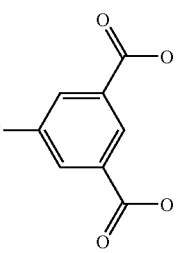

-continued

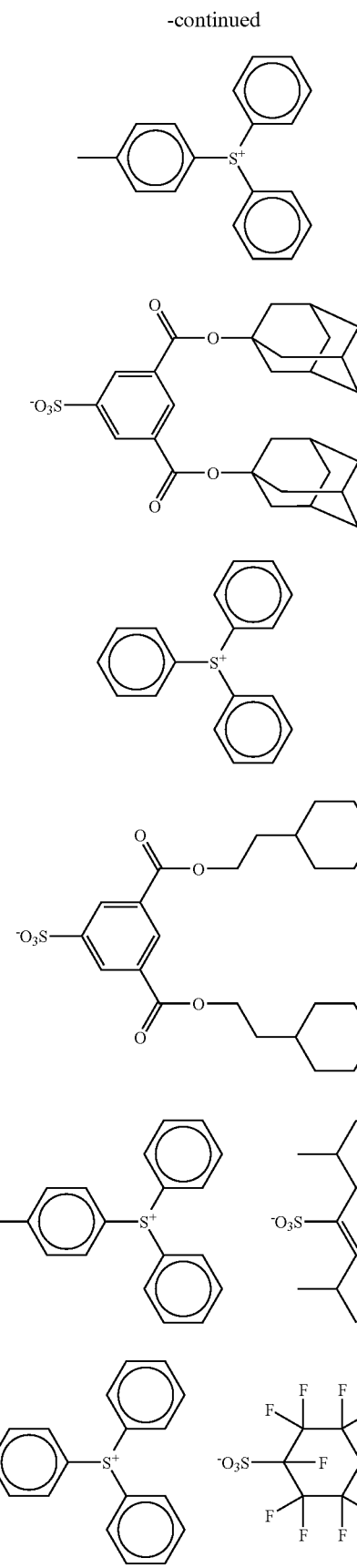

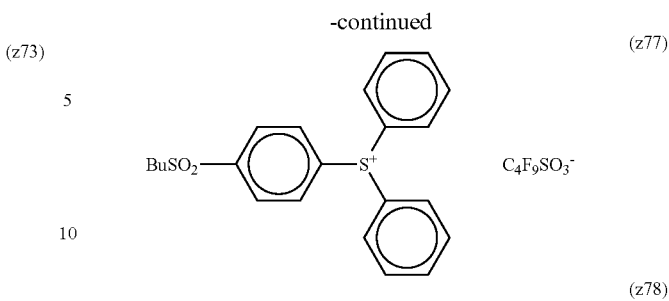

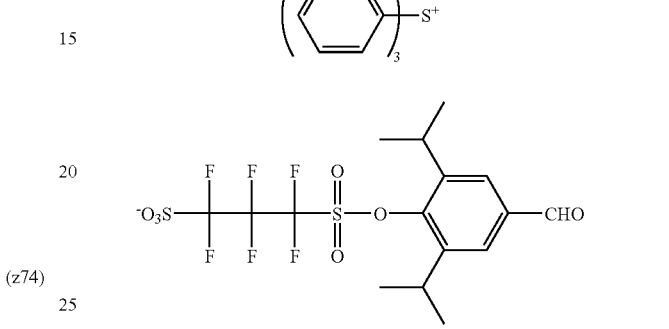

One acid generator may be used alone, or two or more kinds of acid generators may be used in combination. In the case of using two or more kinds of acid generators in combination, compounds capable of generating two kinds of organic acids differing in the total atom number except for hydrogen atom by 2, or more are preferably combined.

The content of the acid generator in the composition is preferably from 0.1 to 20 mass %, more preferably from 0.5 to 10 mass %, still more preferably from 1 to 7 mass %, based on the entire solid content of the resist composition.

[3] (C) Resin Having a Repeating Unit Represented by Formula (C)

The positive resist composition of the present invention comprises a resin having a repeating unit represented by the following formula (C):

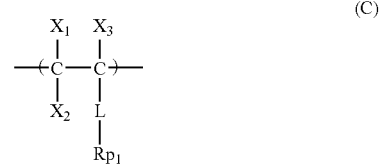

In formula (C), $X_1$, $X_2$ and $X_3$ each independently represents a hydrogen atom, an alkyl group or a halogen atom.

L represents a single bond or a divalent linking group.

$Rp_1$ represents an acid-decomposable group.

The alkyl group of $X_1$, $X_2$ and $X_3$ in formula (C) is preferably a linear or branched alkyl group having a carbon number of 1 to 5, and examples thereof include a methyl group, an ethyl group, an n-propyl group, an isopropyl group, an n-butyl group, an isobutyl group, a sec-butyl group, a pentyl group, an isopentyl group, a neopentyl group and a tert-pentyl group.

The divalent linking group of L is preferably, for example, a sole divalent linking group selected from the group consisting of an alkylene group, a cycloalkylene group, an ether group, a thioether group, a carbonyl group, an ester group, an amido group, a sulfonamido group, a urethane group and a urea group, or a divalent linking group comprising a combination of two or more groups selected therefrom.

The acid-decomposable group of $Rp_1$ is, for example, an alkali-soluble group such as carboxyl group and phenolic hydroxyl group, preferably a group where the hydrogen atom of a carboxyl group is protected by a group which is detached under the action of an acid.

Examples of the group which is detached under the action of an acid include $-C(R_{36})(R_{37})(R_{38})$, $-C(R_{36})(R_{37})(OR_{39})$ and $-C(R_{01})(R_{02})(OR_{39})$.

In the formulae, $R_{36}$ to $R_{39}$ each independently represents an alkyl group, a cycloalkyl group, an aryl group, an aralkyl group or an alkenyl group, and $R_{36}$ and $R_{37}$ may combine with each other to form a ring.

$R_{01}$ and $R_{02}$ each independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be either a monocyclic type or a polycyclic type. The monocyclic type is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic type is preferably a cycloalkyl group having a carbon number of 6 to 20, and examples thereof include an adamantyl group, a norbornyl group, an isoboronyl group, a camphornyl group, a dicylopentyl group, an α-pinel group, a tricyclodecanyl group, a tetracyclododecyl group and an androstanyl group. In the cycloalkyl group, the carbon atom may be partially substituted by a heteroatom such as oxygen atom.

The aryl group of $R_{36}$ to $R_{39}$, $R_{01}$ and $R_{02}$ is preferably an aryl group having a carbon atom of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

$R_{36}$ to $R_{39}$, $R_{01}$ and $R_{02}$ each may have a substituent. Examples of the substituent which $R_{36}$ to $R_{39}$, $R_{01}$ and $R_{02}$ each may have include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group.

Formula (C) is preferably represented by the following formula (C1):

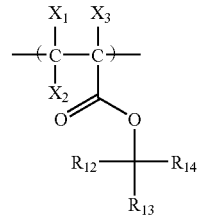

In formula (C1), $X_1$, $X_2$ and $X_3$ each independently represents a hydrogen atom, an alkyl group or a halogen atom.

$R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring.

$X_1$, $X_2$ and $X_3$ in formula (C1) have the same meanings as $X_1$, $X_2$ and $X_3$ in formula (C).

The alkyl group, cycloalkyl group, alkenyl group and aryl group of $R_{12}$, $R_{13}$ and $R_{14}$ are the same as the alkyl group, cycloalkyl group, alkenyl group and aryl group of $R_{36}$ to $R_{38}$ in the above-described group which is detached under the action of an acid.

The repeating unit represented by formula (C1) is preferably a repeating unit where $R_{12}$, $R_{13}$ and $R_{14}$ each is independently an alkyl group or an alkenyl group and at least one of $R_{12}$, $R_{13}$ and $R_{14}$ is an alkyl group.

In the resin (C1), $R_{12}$, $R_{13}$ and $R_{14}$ each independently represents an alkyl group, an alkenyl group or a cycloalkyl group, or a monovalent group formed by bonding at least two of these groups, and the number of carbon atoms contained in $R_{12}$ to $R_{14}$ is from 6 to 20.

Specific examples of the repeating unit represented by formula (C) are set forth below, but the present invention is not limited thereto.

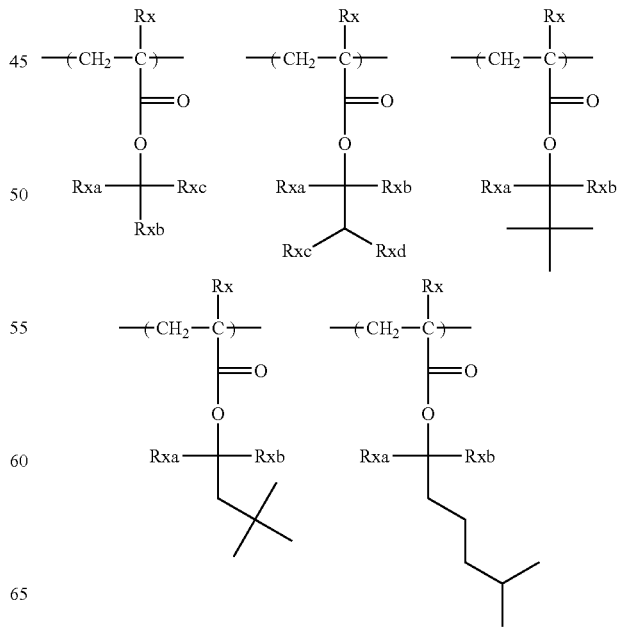

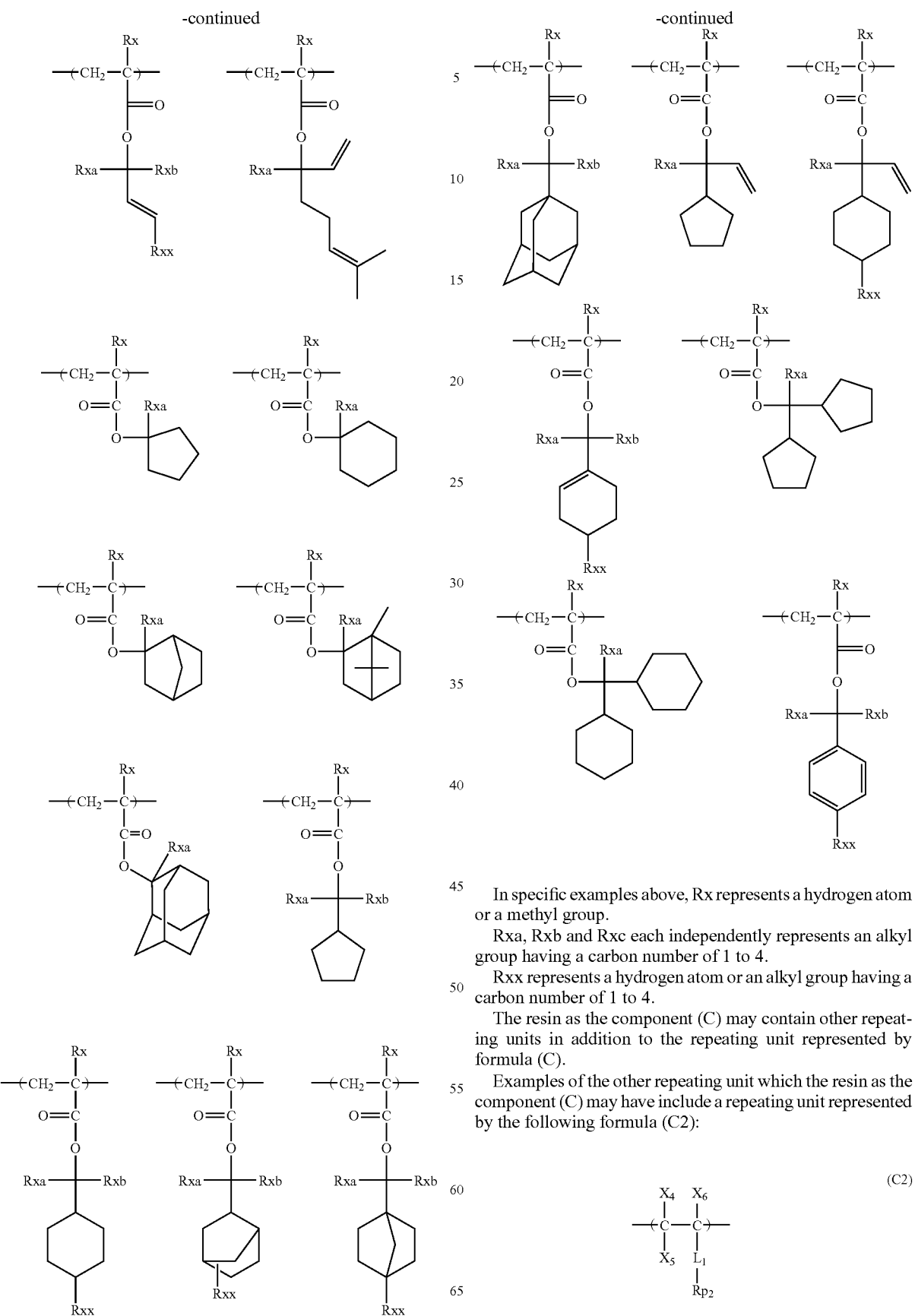

In specific examples above, Rx represents a hydrogen atom or a methyl group.

Rxa, Rxb and Rxc each independently represents an alkyl group having a carbon number of 1 to 4.

Rxx represents a hydrogen atom or an alkyl group having a carbon number of 1 to 4.

The resin as the component (C) may contain other repeating units in addition to the repeating unit represented by formula (C).

Examples of the other repeating unit which the resin as the component (C) may have include a repeating unit represented by the following formula (C2):

In formula (C2), $X_4$, $X_5$ and $X_6$ each independently represents a hydrogen atom, an alkyl group or a halogen atom.

$L_1$ represents a single bond or a divalent linking group.

$Rp_2$ represents a non-acid-decomposable group.

$X_4$, $X_5$ and $X_6$ in formula (C2) are the same as $X_1$, $X_2$ and $X_3$ in formula (C).

The divalent linking group of $L_2$ is the same as the divalent linking group of L in formula (C). The divalent linking group of $L_2$ is preferably an alkylene group, an ester group and an ether group.

Examples of the non-acid-decomposable group of $Rp_2$ include a linear or branched alkyl group (preferably having a carbon number of 2 to 20), a cycloalkyl group (preferably having a carbon number of 3 to 20), an aryl group (preferably having a carbon number of 6 to 15), an alkenyl group (preferably having a carbon number of 2 to 10), which are incapable of decomposing under the action of an acid to produce an alkali-soluble group. This non-acid-decomposable group is preferably a branched alkyl group, a cycloalkyl group or an alkenyl group.

Examples of the other repeating unit which the resin as the component (C) may have further include a repeating unit represented by formula (VIII) in the resin as the component (A).

The resin as the component (C) preferably comprises a repeating unit represented by formula (C1) and a repeating unit represented by formula (C2) in a proportion of 80 to 100 mol %, more preferably from 90 to 100 mol % in total repeating units.

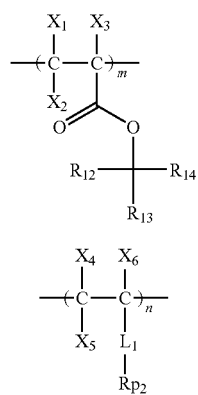

In formulae (C1) and (C2), $X_1$, $X_2$, $X_3$, $X4$, $X_5$ and $X_6$ each independently represents a hydrogen atom, an alkyl group or a halogen atom.

$R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring.

$L_1$ represents a single bond or a divalent linking group.

$RP_2$ represents a non-acid-decomposable group.

m and n each represents a molar ratio of the repeating unit, and m=10 to 100, n=0 to 90 and m+n=100.

The resin as the component (C) preferably further contains a repeating unit selected from the following formulae (C-I) to (C-IV) in a proportion of 80 to 100 mol % in total repeating units, provided that the repeating unit represented by formula (C-I) is used in combination with the repeating unit represented by formula (C-II):

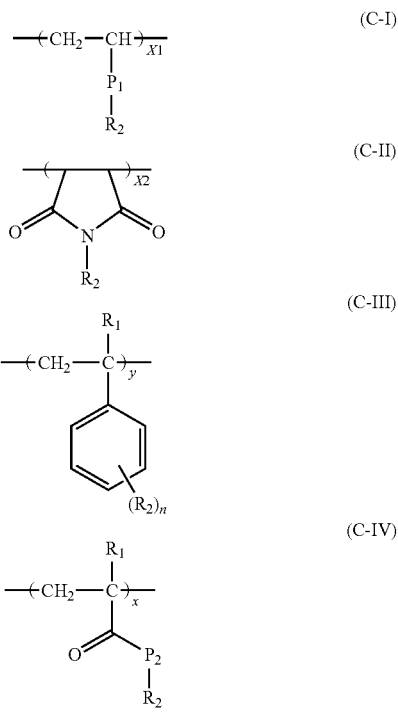

In formulae (C-1) to (C-IV), $R_1$ represents a hydrogen atom or a methyl group;

$R_2$ represents a hydrocarbon group having two or more —$CH_3$ partial structures, provided that when a plurality of $R_2$'s are present, the plurality of $R_2$'s may be the same or different;

$P_1$ represents a single bond, an alkylene group or an ether group, or a linking group having two or more thereof;

$P_2$ represents a linking group selected from —O—, —NR— and —$NHSO_2$—, wherein R represents a hydrogen atom or an alkyl group;

x1, x2, y and z represent mol % in total repeating units, and x1 represents a number of 0 to 50, x2 represents a number of 0 to 50, y represents a number of 0 to 100, z represents a number of 0 to 100, provided that x1, x2, y and z satisfy $80 \leq x1+x2+y+z \leq 100$; and n represents an integer of from 1 to 4.

The hydrocarbon group having at least two —$CH_3$ partial structures of $R_2$ in formulae (C-I) to (C-IV) includes, for example, an alkyl group, an alkyloxy group, an alkyl-substituted cycloalkyl group, an alkyl-substituted alkenyl group, an alkyl-substituted aryl group and an alkyl-substituted aralkyl group each having at least two —$CH_3$ partial structures. An alkyl group and an alkyl-substituted cycloalkyl group each having at least two —$CH_3$ partial structures are preferred.

Examples of the hydrocarbon group having at least two —$CH_3$ partial structures of $R_2$ in formulae (C-I) to (C-IV) include an alkyl group having at least two —$CH_3$ partial structures, an alkyloxy group having at least two —$CH_3$ partial structures, a cycloalkyl group substituted by at least two alkyl groups having one —$CH_3$ partial structure or by at least one alkyl group having at least two —$CH_3$ partial structures, an alkenyl group substituted by at least two alkyl groups having one —$CH_3$ partial structure or by at least one alkyl group having at least two —$CH_3$ partial structures, an aryl group substituted by at least two alkyl groups having one —$CH_3$ partial structure or by at least one alkyl group having at least two —CH₃ partial structures, and an aralkyl group substituted by at least two alkyl groups having one —CH₃ partial structure or by at least one alkyl group having at least two —CH₃ partial structures. Among these, preferred are an alkyl group having at least two —CH₃ partial structures, an alkyloxy group having at least two —CH₃ partial structures, and a cycloalkyl group substituted by at least two alkyl groups having one —CH₃ partial structure or by at least one alkyl group having at least two —CH₃ partial structures. The alkyl group having at least two —CH₃ partial structures may be substituted by a cycloalkyl group.

The alkyl group having at least two —CH₃ partial structures of $R_2$ is preferably a branched alkyl group having a carbon number of 3 to 20. Specific preferred examples of the alkyl group include an isopropyl group, an isobutyl group, a tert-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group. Among these, more preferred are an isobutyl group, a tert-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group.

The alkyl group having one —CH₃ partial structure of $R_2$ is preferably a linear alkyl group having a carbon number of 1 to 20. Specific preferred examples of the alkyl group include a methyl group, an ethyl group, a propyl group, a butyl group, a pentyl group, a hexyl group, a heptyl group, an octyl group and a nonyl group.

The alkyloxy group having at least two —CH₃ partial structures of $R_2$ includes a group resulting from bonding of an ether group to an alkyl group having at least two —CH₃ partial structures.

The cycloalkyl group of $R_2$ may be monocyclic or polycyclic and specifically includes a group having a carbon number of 5 or more and having a monocyclo, bicyclo, tricyclo or tetracyclo structure or the like. The carbon number thereof is preferably from 6 to 30, more preferably from 7 to 25. Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group, and still more preferred are a norbornyl group, a cyclopentyl group and a cyclohexyl group.

The alkenyl group of $R_2$ is preferably a linear or branched alkenyl group having a carbon number of 1 to 20, more preferably a branched alkenyl group.

The aryl group of $R_2$ is preferably an aryl group having a carbon number of 6 to 20, and examples thereof include a phenyl group and a naphthyl group, with a phenyl group being preferred.

The aralkyl group of $R_2$ is preferably an aralkyl group having a carbon number of 7 to 12, and examples thereof include a benzyl group, a phenethyl group and a naphthylmethyl group.

Specific examples of the hydrocarbon group having at least two —CH₃ partial structures of $R_2$ in formulae (C-I) and (C-III) include an isopropyl group, an isobutyl group, a tert-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-tert-butylcyclohexyl group and an isobornyl group. Among these, preferred are an isobutyl group, a tert-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-tert-butylcyclohexyl group and an isobornyl group.

Specific examples of the hydrocarbon group having at least two —CH₃ partial structures of $R_2$ in formula (C-IV) include an isobutyl group, a tert-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group and a 4-tert-butylcyclohexyl group. Among these, preferred are an isobutyl group, a tert-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 2,6-dimethylheptyl group, a 3,5-dimethylcyclohexyl group, a 4-isopropylcyclohexyl group and a 4-tert-butylcyclohexyl group.

In the resin having a repeating unit selected from formulae (C-I) to (C-IV), $80 \leq x1+x2+y+z \leq 100$, preferably $85 \leq x1+x2+y+z \leq 100$, more preferably $90 \leq x1+x2+y+z \leq 100$.

In the resin having a repeating unit selected from formulae (C-I) to (C-IV), at least one repeating unit selected from formulae (C-I) to (C-IV) preferably has an acid-decomposable group.

Examples of the acid-decomposable group in formulae (C-I) to (C-IV) are the same as those of the acid-decomposable group of $Rp_1$ in formula (C).

Specific preferred examples of the repeating units represented by formulae (C-I) and (C-II) are set forth below, but the present invention is not limited thereto.

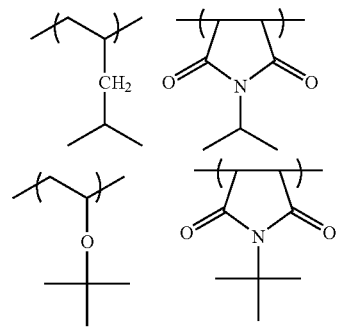

-continued

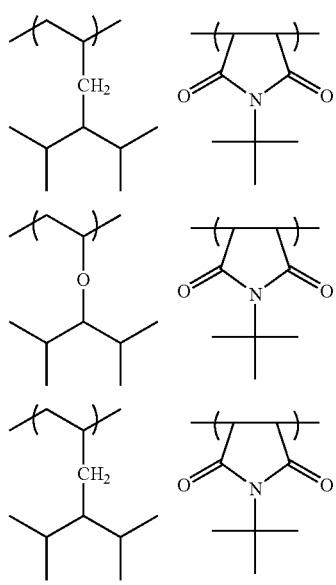

Specific preferred examples of the repeating unit represented by formula (C-III) are set forth below, but the present invention is not limited thereto.

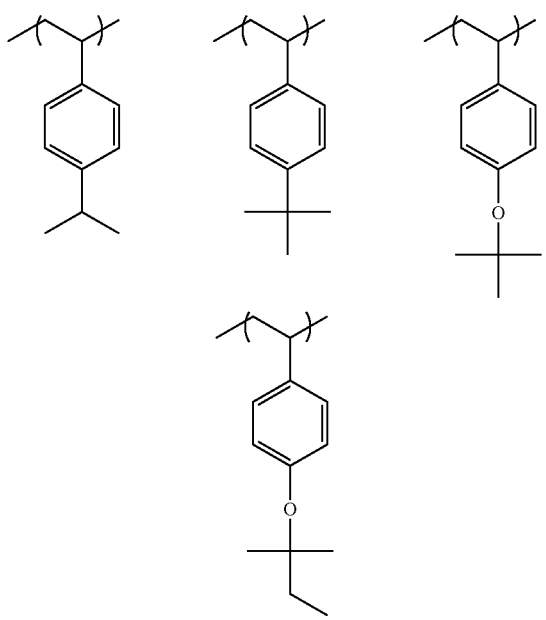

In formula (C-IV), when $P_2$ is oxygen atom, the carbon atom directly bonded to the oxygen atom is preferably secondary or tertiary and in the case of a tertiary carbon atom, the structure becomes the same as that of the repeating unit represented by formula (C1).

Specific preferred examples of the repeating unit represented by formula (C-IV), other than the repeating unit represented by formula (C1), are set forth below, but the present invention is not limited thereto. In specific examples, Rxy represents a hydrogen atom or a methyl group.

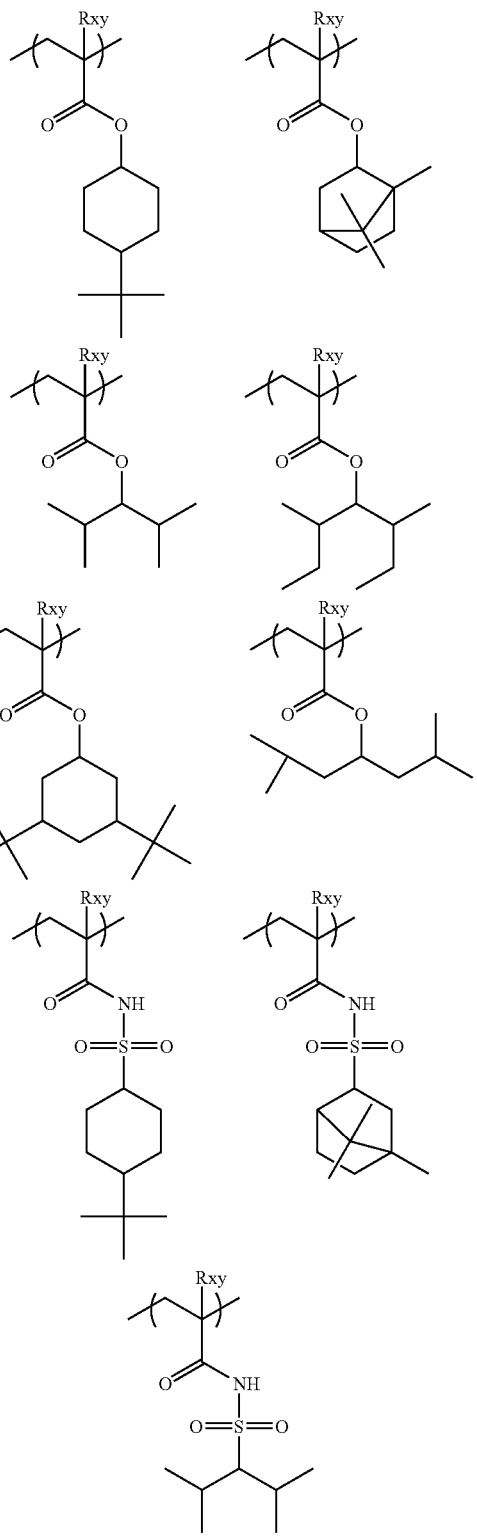

The resin as the component (C) preferably has no silicon atom and no fluorine tom.

The resin as the component (C) preferably has no element other than carbon atom, hydrogen atom, oxygen atom, nitrogen atom and sulfur atom.

The resin as the component (C) preferably contains a repeating unit having an acid-decomposable group at a proportion of 5 to 100 mol %, more preferably from 10 to 100 mol %.

The resin as the component (C) preferably has a weight average molecular weight of 1,500 to 100,000, more preferably from 2,000 to 70,000, still more preferably from 3,000 to 50,000, particularly preferably from 3,000 to 15,000. The resin as the component (C) preferably has a dispersity (Mw/Mn) of 1.0 to 3.0, more preferably from 1.2 to 2.5, still more preferably from 1.2 to 2.0.

The resin as the component (C) may be synthesized in the same manner as the resin of the component (A). A chain transfer agent can be used according to necessity.

The content of the resin as the component (C) is from 0.1 to 20 mass %, preferably from 0.1 to 10 mass %, more preferably from 0.1 to 5 mass %, still more preferably from 0.1 to 3 mass %, yet still more preferably from 0.5 to 2 mass %, based on the solid content of the positive resist composition (all solid contents constituting the resist film).

[4] (D) Organic Solvent

Examples of the solvent which can be used for dissolving respective components described above to prepare a positive resist composition include an alkylene glycol monoalkyl ether carboxylate, an alkylene glycol monoalkyl ether, an alkyl lactate, an alkyl alkoxypropionate, a cyclic lactone having a carbon number of 4 to 10, a monoketone compound having a carbon number of 4 to 10 which may contain a ring, an alkylene carbonate, an alkyl alkoxyacetate and an alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used includes a solvent having a boiling point of 130° C. or more at ordinary temperature and atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more species thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxy-propionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) between the hydroxyl group-containing solvent and the hydroxyl group-free solvent is from 1/99 to 99/1, preferably from 10/90 to 90/10, more preferably from 20/80 to 60/40. A mixed solvent containing a hydroxy group-free solvent in a proportion of 50 mass % or more is preferred in view of coating uniformity.

[5] (E) Basic Compound

The positive resist composition of the present invention preferably comprises (E) a basic compound for reducing the change of performance in aging from exposure until heating.

Preferred examples of the basic compound include compounds having a structure represented by any one of the following formulae (A) to (E):

(A)

-continued

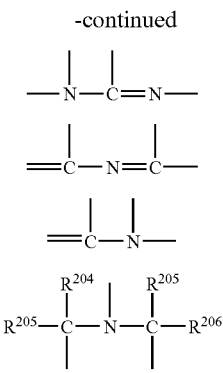

In formulae (A) to (E), $R^{200}$, $R^{201}$ and $R^{202}$, which may be the same or different, each represents a hydrogen atom, an alkyl group having a carbon number of 1 to 20, a cycloalkyl group having a carbon number of 3 to 20, or an aryl group having a carbon number of 6 to 20, and $R^{201}$ and $R^{202}$ may combine with each other to form a ring.

The alkyl group may be unsubstituted or may be an alkyl group having a substituent, and the alkyl group having a substituent is preferably an aminoalkyl group having a carbon number of 1 to 20, a hydroxyalkyl group having a carbon number of 1 to 20, or a cyanoalkyl group having a carbon number of 1 to 20.

$R^{203}$, $R^{204}$, $R^{205}$ and $R^{206}$, which may be the same or different, each represents an alkyl group having a carbon number of 1 to 20.

The alkyl group in these formulae (A) to (E) is more preferably unsubstituted.

Examples of the basic compound include substituted or unsubstituted primary, secondary or tertiary aliphatic amines, aromatic amines, heterocyclic amines, amide derivatives, imide derivatives, and nitrogen-containing compounds having a cyano group. Among these, aliphatic amines, aromatic amines and heterocyclic amines are preferred. Preferred substituents which these compounds each may have include an amino group, an alkyl group, an alkoxyl group, an acyl group, an acyloxy group, an aryl group, an aryloxy group, a nitro group, a cyano group, an ester group and a lactone group.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds is used alone, or two or more species thereof are used in combination.

The amount of the basic compound used is usually from 0.001 to 10 mass %, preferably from 0.01 to 5 mass %, based on the solid content of the positive resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern in aging after exposure until heat treatment. The ratio of acid generator/basic compound (by mol) is more preferably from 5.0 to 200, still more preferably from 7.0 to 150.

[6] (F) Surfactant

The positive resist composition of the present invention preferably further comprises (F) a surfactant, more preferably any one fluorine-containing and/or silicon-containing surfactant (a fluorine-containing surfactant, a silicon-containing surfactant, or a surfactant containing both a fluorine atom and a silicon atom), or two or more species thereof.

When the positive resist composition of the present invention contains the (F) surfactant, a resist pattern with good sensitivity, resolution and adhesion as well as less development defects can be obtained when an exposure light source of 250 nm or less, particularly 220 nm or less, is used.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K. K.); Florad FC430, 431 and 4430 (produced by Sumitomo 3M Inc.); Megafac F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); Eftop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene))acrylate (or methacrylate) may be not only a binary copolymer but also a ternary or greater copolymer obtained by simultaneously copolymerizing two or more different fluoro-aliphatic group-containing monomers or two or more different (poly(oxyalkylene))acrylates (or methacrylates).

Examples thereof include, as the commercially available surfactant, Megafac F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene))acrylate (or methacrylate), and a copolymer of a $C_3F_7$ group-containing acrylate (or methacrylate) with a (poly(oxyethylene)) acrylate (or methacrylate) and a (poly(oxypropylene))acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several species thereof may be used in combination.

The amount of the (F) surfactant used is preferably from 0.01 to 10 mass %, more preferably from 0.1 to 5 mass %, based on the entire amount of the positive resist composition (excluding the solvent).

[7] (G) Onium Carboxylate

The positive resist composition of the present invention may comprise an onium carboxylate. Examples of the onium carboxylate include sulfonium carboxylate, iodonium carboxylate and ammonium carboxylate. In particular, the onium carboxylate is preferably an iodonium salt or a sulfonium salt. Furthermore, the carboxylate residue of the onium carboxylate for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of the carboxylic acid with the alkyl group being partially or entirely fluorine-substituted. The alkyl chain may contain an oxygen atom. By virtue of such a construction, the transparency to light at 220 nm or less is ensured, the sensitivity and resolution are enhanced, and the defocus latitude depended on line pitch and the exposure margin are improved.

Examples of the anion of a fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluoro-tridecanoic acid, perfluorocyclohexanecarboxylic acid and 2,2-bistrifluoromethylpropionic acid.

These onium carboxylates can be synthesized by reacting silver oxide with a sulfonium, iodonium or ammonium hydroxide and a carboxylic acid in an appropriate solvent.

The content of the onium carboxylate in the composition is suitably from 0.1 to 20 mass %, preferably from 0.5 to 10 mass %, more preferably from 1 to 7 mass %, based on the entire solid content of the composition.

Other Additives:

The positive resist composition of the present invention may further contain, for example, a dye, a plasticizer, a photosensitizer, a light absorbent, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art with reference to the methods described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

[Physical Properties of Resist Composition]

The positive resist composition of the present invention is preferably used in a film thickness of 30 to 250 nm, more preferably from 30 to 200 nm, from the standpoint of enhancing the resolving power. Such a film thickness can be obtained by setting the solid content concentration in the positive resist composition to an appropriate range and thereby giving an appropriate viscosity to enhance the coatability and film-forming property.

The entire solid content concentration in the positive resist composition is generally from 1 to 10 mass %, preferably from 1 to 8 mass %, more preferably from 1.0 to 7.0 mass %, still more preferably from 1.0 to 6.0 mass %.

[Pattern Forming Method]

The positive resist composition of the present invention is used by dissolving the components described above in a predetermined organic solvent, preferably in the above-described mixed solvent, filtering the solution, and coating it on a predetermined support as follows. The filter used for filtering is preferably a filter made of polytetrafluoroethylene, polyethylene or nylon and having a pore size of 0.1 micron or less, more preferably 0.05 microns or less, still more preferably 0.03 microns or less.

For example, the positive resist composition is coated on a substrate (e.g., silicon/silicon dioxide-coated substrate) as used in the production of a precision integrated circuit device, by an appropriate coating method such as spinner or coater, and then dried to form a resist film.

From the standpoint of enhancing the resolving power, the positive resist composition of the present invention is preferably used in a film thickness of 30 to 500 nm, more preferably from 30 to 250 nm, still more preferably from 30 to 200 nm.

This resist film is irradiated with actinic rays or radiation through a predetermined mask, preferably baked (heated), then developed and rinsed, whereby a good resist pattern can be obtained.

Examples of the actinic rays or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specific examples thereof include KrF excimer laser light (248 nm), ArF excimer laser light (193 nm), $F_2$ excimer laser light (157 nm), X-ray and electron beam. ArF excimer laser light, $F_2$ excimer laser light, EUV (13 nm) and electron beam are preferred.

In the development step, an alkali developer is used as follows. The alkali developer which can be used for the resist composition is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimetylethanolamine and triethanolamine, quaternary ammonium salts such as tetramethylammonium hydroxide and tetraethylammonium hydroxide, and cyclic amines such as pyrrole and piperidine.

Furthermore, this alkali developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

Also, the above-described alkaline aqueous solution may be used after adding thereto alcohols and a surfactant each in an appropriate amount.

As for the rinsing solution, pure water is used, and the pure water may be used after adding thereto a surfactant in an appropriate amount.

The development or ringing may be performed by forming a puddle or by a puddleless process. In the case of immersion exposure, a rinsing step may be provided before and after the exposure.

After the development or rinsing, the developer or rinsing solution adhering on the pattern may removed by a supercritical fluid.

The exposure may be performed by filling a liquid (immersion medium) having a refractive index higher than that of air between the resist film and a lens at the irradiation with actinic rays or radiation (immersion exposure). By this exposure, the resolution can be enhanced. The immersion medium used may be any liquid as long as it has a refractive index higher than that of air, but pure water is preferred. Also, in order to prevent the immersion medium and the photosensitive film from coming into direct contact at the immersion exposure, an overcoat layer may be further provided on the photosensitive film. In this case, the composition can be restrained from dissolving out into the immersion medium from the photosensitive film and the development defects can be reduced.

The immersion liquid used in the immersion exposure is described below.

The immersion liquid is preferably a liquid transparent to light at the exposure wavelength and having a small temperature coefficient of refractive index as much as possible so as to minimize the distortion of an optical image projected on the resist. Particularly, when the exposure light source is an ArF excimer laser (wavelength: 193 nm), water is preferably used in view of easy availability and easy handleability, in addition to the above-described aspects.

Furthermore, a medium having a refractive index of 1.5 or more may also be used because the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist layer on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist. Therefore, the water used is preferably distilled water. Pure water after further filtration through an ion exchange filter or the like may also be used.

The electrical resistance of water is preferably 18.3 MΩcm or more, and TOC (organic material concentration) is preferably 20 ppb or less. Also, the water is preferably subjected to a deaeration treatment.

The lithography performance can be enhanced by increasing the refractive index of the immersion liquid. From such an aspect, an additive for increasing the refractive index may be added to water, or heavy water ($D_2O$) may be used in place of water.

In order to prevent the resist film from directly contacting with the immersion liquid, an immersion liquid sparingly soluble film (hereinafter, sometimes referred to as a "topcoat") may be provided between the immersion liquid and the resist film formed of the positive resist composition of the present invention. The functions required of the topcoat are suitability for coating on the resist upper layer part, transparency to radiation particularly at 193 nm, and low solubility in the immersion liquid. It is preferred that the topcoat does not intermix with the resist and can be uniformly coated on the resist upper layer.

In view of transparency to light at 193 nm, the topcoat preferably comprises an aromatic-free polymer, and specific examples thereof include a hydrocarbon polymer, an acrylic acid ester polymer, a polymethacrylic acid, a polyacrylic acid, a polyvinyl ether, a silicon-containing polymer and a fluorine-containing polymer. If impurities dissolve out into the immersion liquid from the topcoat, the optical lens is contaminated. In this viewpoint, the topcoat preferably less contains residual monomer components of the polymer.

On peeling off the topcoat, a developer may be used or a releasing agent may be separately used. The releasing agent is preferably a solvent which less permeates into the resist. From the standpoint that the peeling step can be performed simultaneously with the resist development step, the topcoat is preferably peelable with an alkali developer and in the light of peeling with an alkali developer, the topcoat is preferably acidic, but in view of non-intermixing with the resist, the topcoat may be neutral or alkaline.

With no difference in the refractive index between the topcoat and the immersion liquid, the resolving power is enhanced. At the exposure with an ArF excimer laser (wavelength: 193 nm), when water is used as the immersion liquid, the topcoat for ArF immersion exposure preferably has a refractive index close to the refractive index of the immersion liquid. From the standpoint of approximating the refractive index to that of the immersion liquid, the topcoat preferably contains a fluorine atom. Also, in view of transparency and refractive index, the topcoat is preferably a thin film.

The topcoat is preferably free of intermixing with the resist and further with the immersion liquid. From this standpoint, when the immersion liquid is water, the topcoat solvent is preferably a medium which is sparingly soluble in the resist solvent and insoluble in water. Furthermore, when the immersion liquid is an organic solvent, the topcoat may be either water-soluble or water-insoluble.

When the positive resist composition of the present invention is used, the resin (C) contained in the resist is unevenly distributed to the surface, so that the contact angle (particularly receding contact angle) on the film surface can be enhanced. When formed as a resist film, the receding contact angle of water for the resist film is preferably 60° or more, more preferably 65° or more, still more preferably 70° or more. Also, when only the resin (C) is dissolved in a solvent and the resulting solution is coated, the receding contact angle of the film formed is preferably from 70 to 110°. The receding contact angle of the resist film on use is adjusted to 60 to 80° by controlling the amount of the resin (C) added.

The receding contact angle here is a receding contact angle at ordinary temperature and atmospheric pressure. The receding contact angle is a contact angle on the receding end of a liquid droplet when the liquid droplet starts sliding down after the resist film is inclined.

EXAMPLES

The present invention is described in greater detail below by referring to Examples, but the present invention should not be construed as being limited thereto.

Synthesis Example 1

(Synthesis of Resin (C-1))

Ethyl methacrylate and tert-butyl methacrylate were charged at a ratio of 50/50 (by mol) and dissolved in cyclohexanone to prepare 450 g of a solution having a solid content concentration of 22 mass %. To this solution, 5 mol % of polymerization initiator V-601 produced by Wako Pure Chemical Industries, Ltd. was added. The resulting solution was added dropwise to 50 mL of cyclohexanone heated at 80° C., over 2 hours in a nitrogen atmosphere. After the completion of dropwise addition, the solution was stirred for 2 hours to obtain a reaction solution. The reaction solution was cooled to room temperature and crystallized from a 10-fold amount of methanol, and the precipitated white powder was collected by filtration to recover the objective Resin (C-1).

The polymer compositional ratio (by mol) determined from $^1$HNMR was 50/50. Also, the weight average molecular weight determined by the GPC measurement and calculated in terms of standard polystyrene was 10,000, and the dispersity was 2.2.

Resins (C-2) to (C-20) as the component (C) were synthesized in the same manner as in Synthesis Example 1.

The structures of Resins (C-1) to (C-20) are shown below.

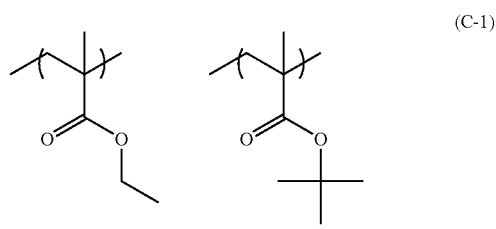

(C-1)

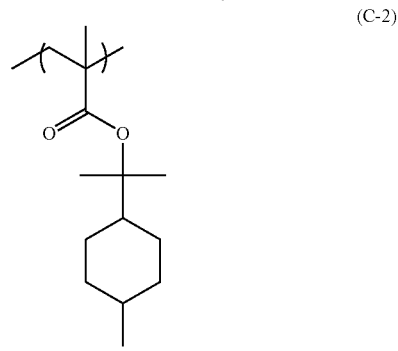

(C-2)

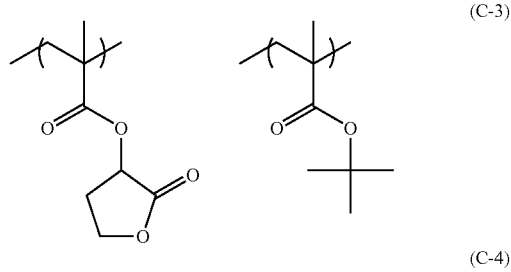

(C-3)

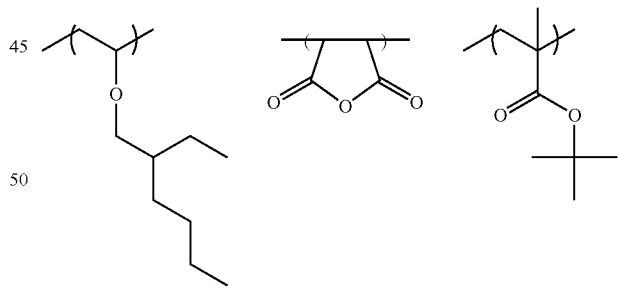

(C-4)

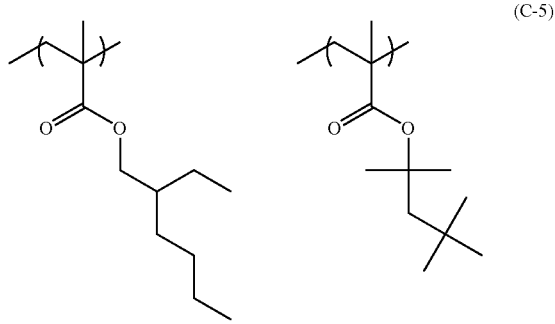

(C-5)

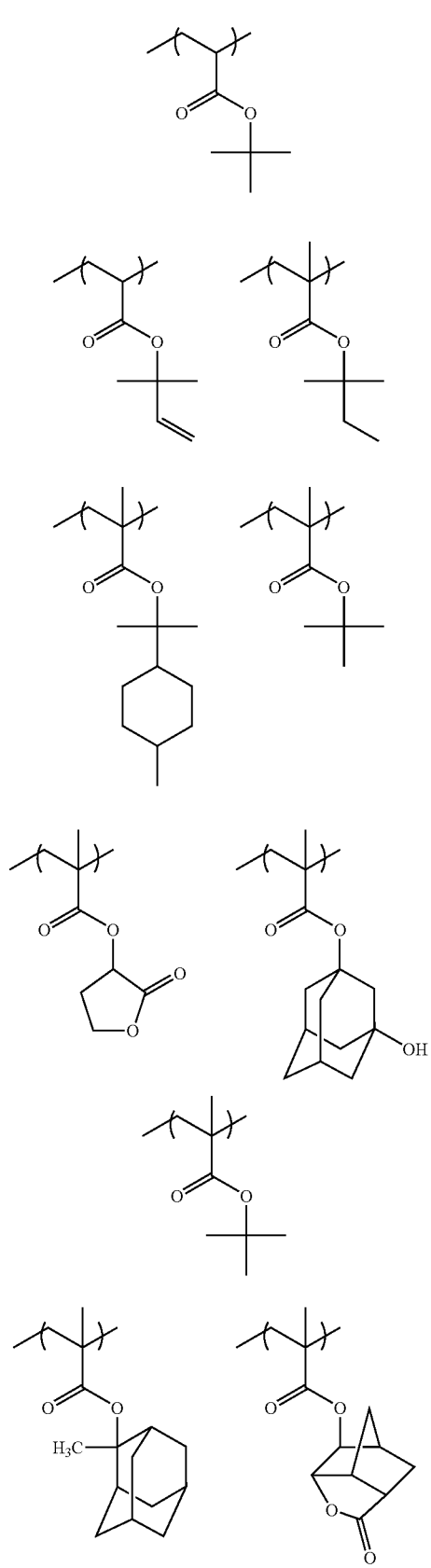
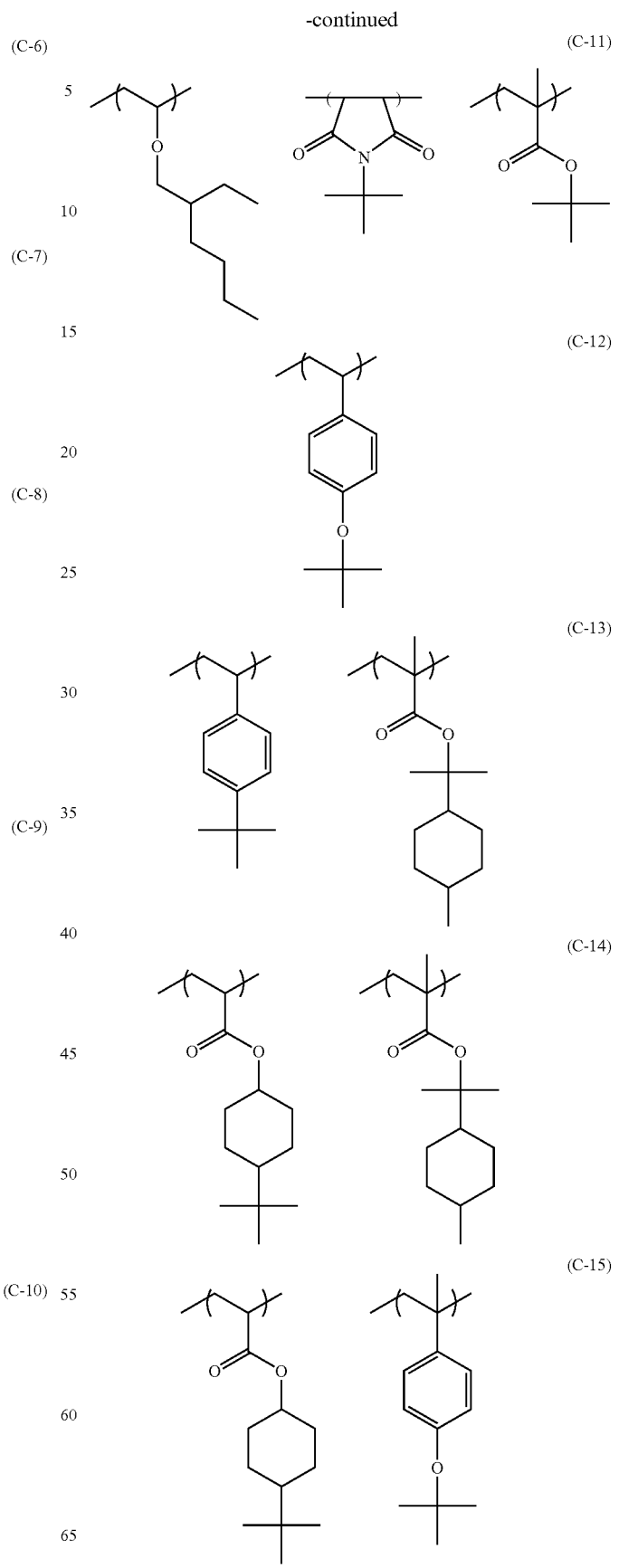

-continued

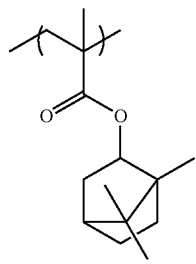
(C-16) (C-17)
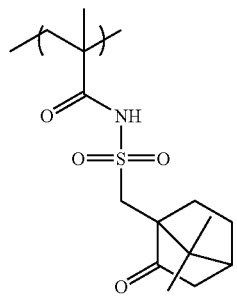

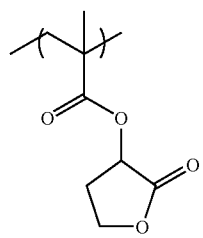
(C-18)
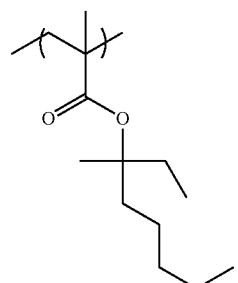

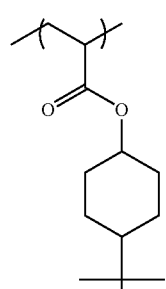
(C-19) (C-20)
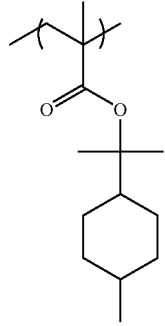

The composition (molar ratio, corresponding to respective repeating units from the left), Mw (weight average molecular weight) and Mw/Mn (dispersity) in each of Resins (C-1) to (C-20) are shown in Table 1 and Table 2 below.

TABLE 1

| Resin | Composition | Mw | Mw/Mn |
|---|---|---|---|
| C-1 | 50/50 | 10000 | 2.2 |
| C-2 | 100 | 8500 | 1.8 |
| C-3 | 40/60 | 12000 | 2.2 |
| C-4 | 30/30/40 | 6700 | 2.0 |
| C-5 | 50/50 | 9800 | 2.3 |

TABLE 1-continued

| Resin | Composition | Mw | Mw/Mn |
|---|---|---|---|
| C-6 | 100 | 6800 | 1.8 |
| C-7 | 40/60 | 4800 | 2.0 |
| C-8 | 50/50 | 8500 | 2.2 |
| C-9 | 20/20/60 | 9800 | 2.3 |
| C-10 | 60/40 | 10000 | 2.2 |

TABLE 2

| Resin | Composition | Mw | Mw/Mn |
|---|---|---|---|
| C-11 | 30/30/40 | 7000 | 2.0 |
| C-12 | 100 | 8000 | 1.8 |
| C-13 | 50/50 | 8000 | 2.0 |
| C-14 | 50/50 | 8000 | 2.0 |
| C-15 | 50/50 | 7500 | 2.3 |
| C-16 | 80/20 | 10000 | 2.1 |
| C-17 | 70/30 | 10000 | 2.1 |
| C-18 | 20/80 | 12000 | 2.2 |
| C-19 | 30/50/20 | 13000 | 2.0 |
| C-20 | 40/50/10 | 13000 | 2.0 |

The structures of Resins (1) to (25) as the component (A) used in Examples are shown below.

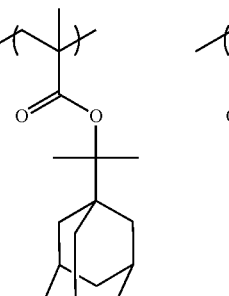
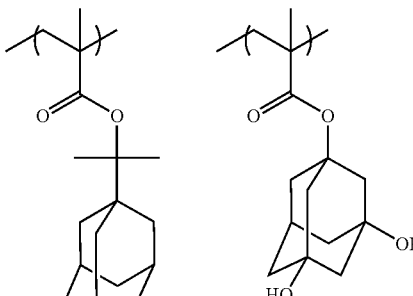
(1)

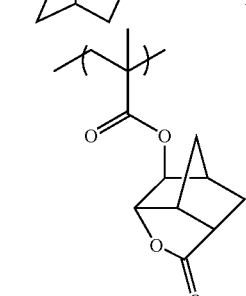

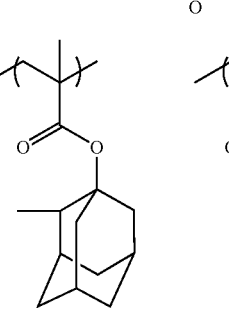
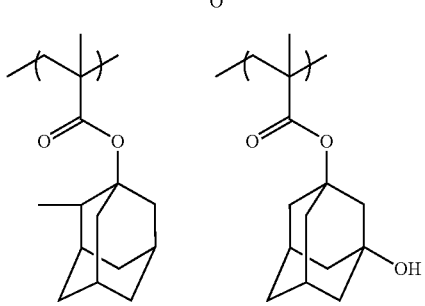
(2)

-continued
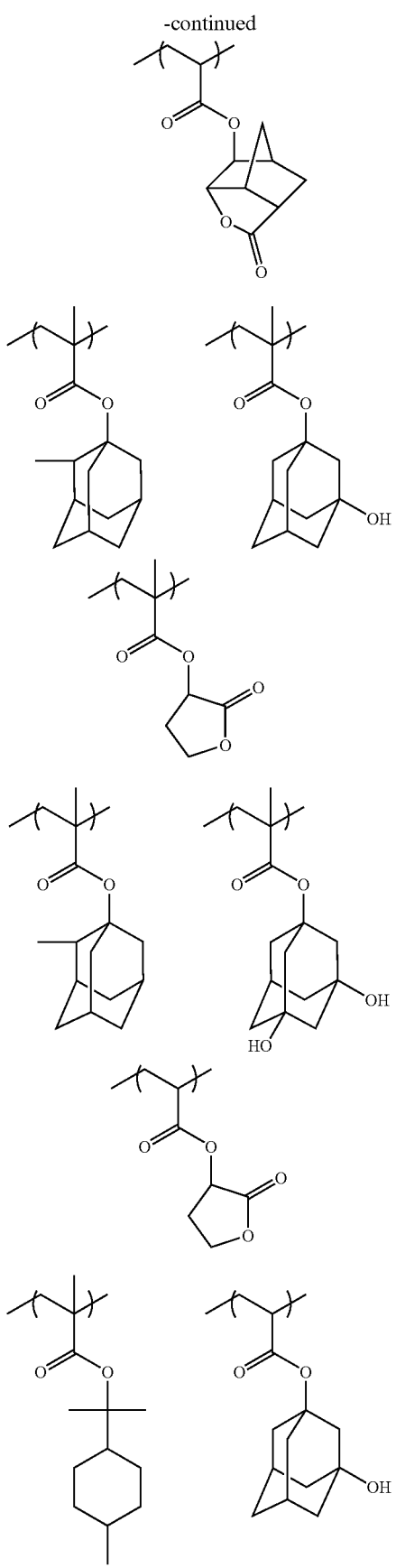
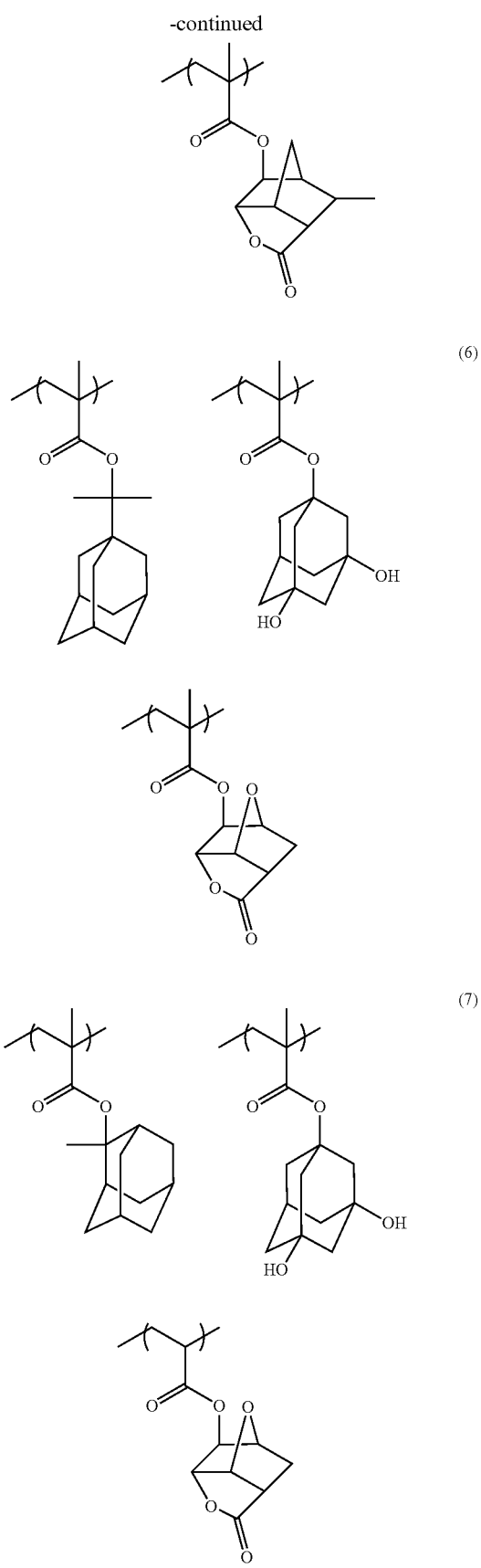

(8)
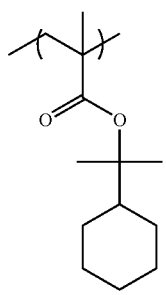 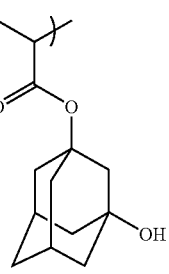
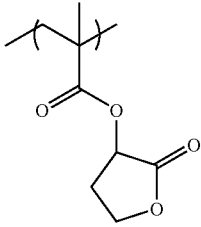 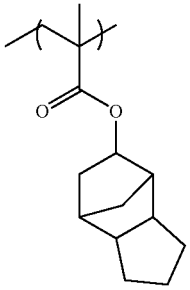
(11)
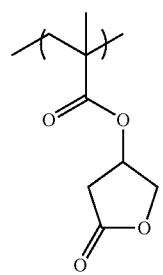
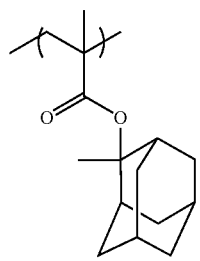 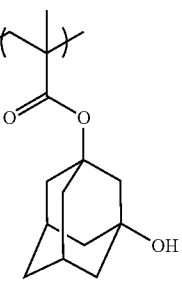
(9)
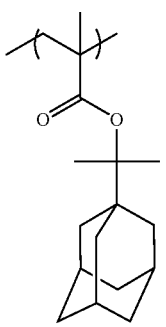 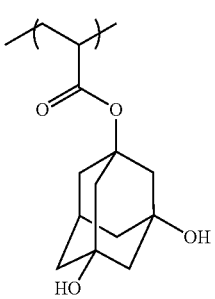
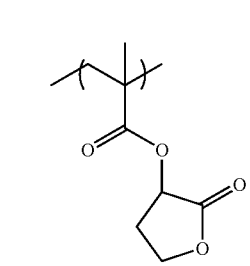 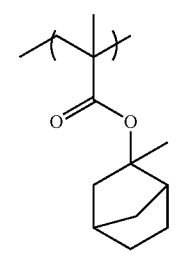
(12)
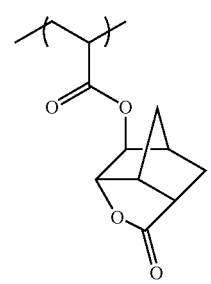
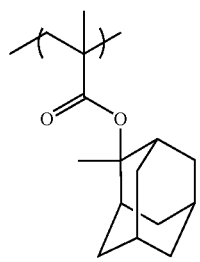 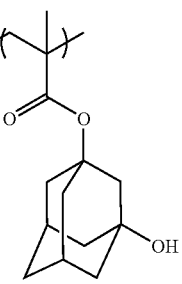
(10)
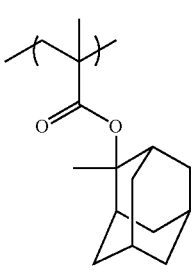 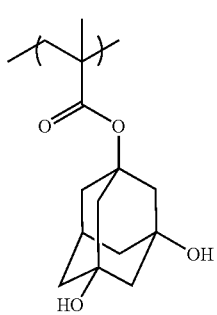
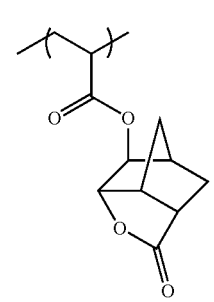 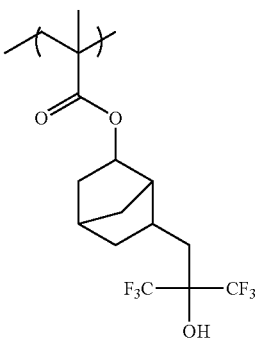

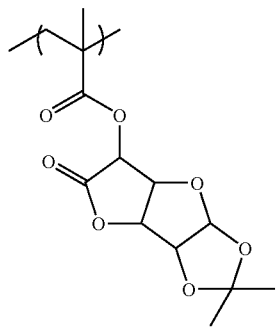 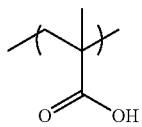
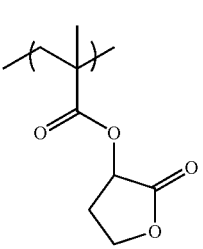 (21)
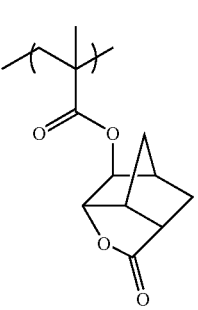
(19)
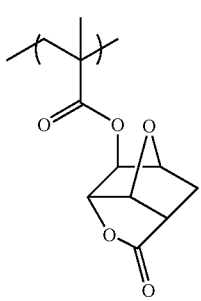 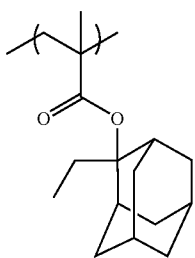
(22)
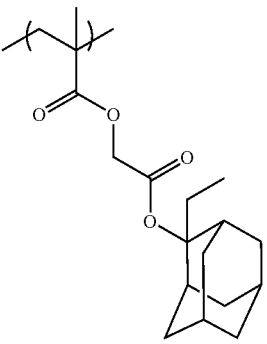 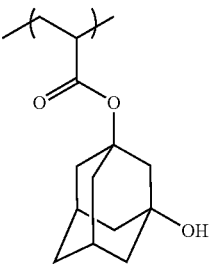
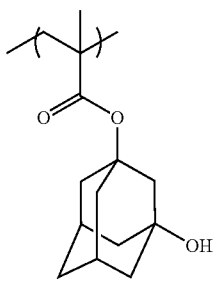 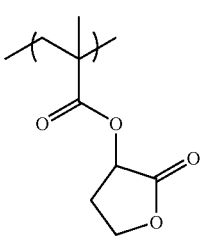
(20)
(23)
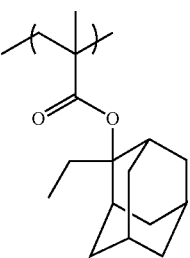 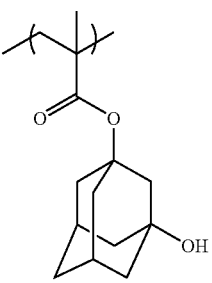

-continued

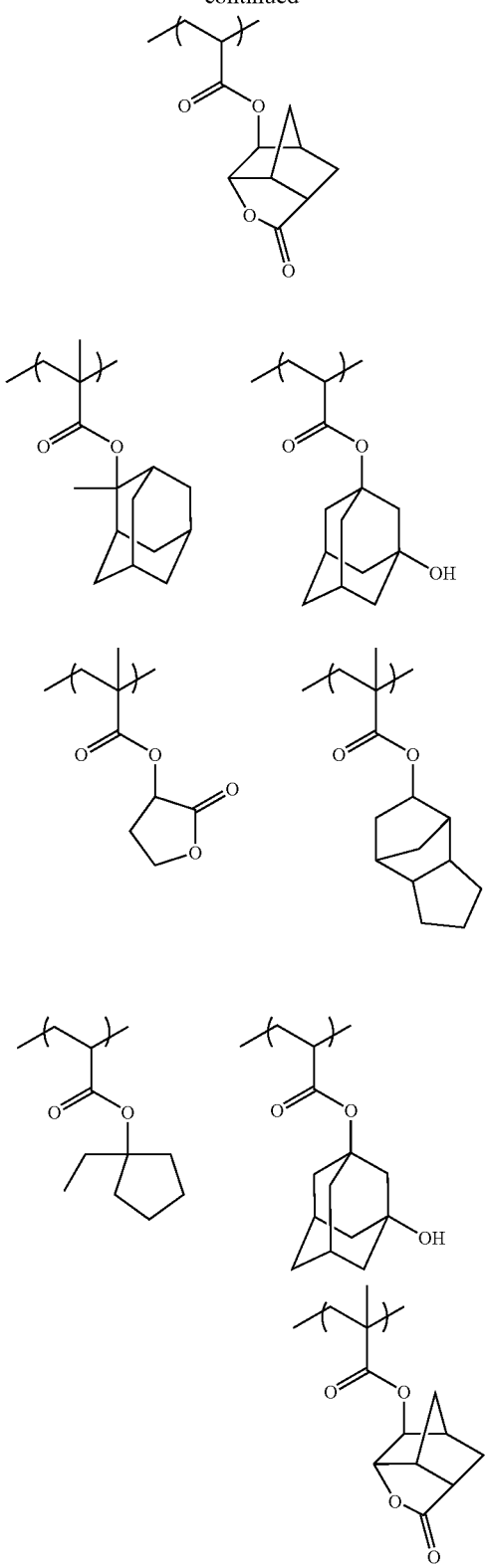

(24)

(25)

The compostion (molar ratio, corresponding to respective repeating units from the left), Mw (wieght average molecular weight) and Mw/Mn (dispersity) in each of Resins (1) to (25) are shown in Table 3 and Table 4 below.

TABLE 3

| Resin | Composition | Mw | Mw/Mn |
|---|---|---|---|
| 1 | 24/30/46 | 9800 | 1.9 |
| 2 | 30/25/45 | 8500 | 2.0 |
| 3 | 34/33/33 | 11000 | 2.3 |
| 4 | 45/15/40 | 10500 | 2.1 |
| 5 | 30/25/45 | 8400 | 2.3 |
| 6 | 39/20/41 | 10500 | 2.1 |
| 7 | 49/10/41 | 9500 | 2.5 |
| 8 | 35/32/33 | 14000 | 2.6 |
| 9 | 40/20/35/5 | 12500 | 2.4 |
| 10 | 40/15/40/5 | 10000 | 1.8 |
| 11 | 40/15/40/5 | 9800 | 2.3 |
| 12 | 35/20/40/5 | 6100 | 2.3 |
| 13 | 30/30/30/10 | 8600 | 2.5 |
| 14 | 40/20/35/5 | 12000 | 2.1 |
| 15 | 50/50 | 5200 | 2.1 |

TABLE 4

| Resin | Composition | Mw | Mw/Mn |
|---|---|---|---|
| 16 | 30/20/40/10 | 8000 | 2.0 |
| 17 | 40/10/50 | 6000 | 1.8 |
| 18 | 30/20/40/10 | 8500 | 1.5 |
| 19 | 35/30/35 | 9800 | 1.8 |
| 20 | 30/40/30 | 9500 | 1.9 |
| 21 | 25/25/50 | 6700 | 2.0 |
| 22 | 50/25/25 | 12000 | 2.0 |
| 23 | 50/30/20 | 10000 | 2.0 |
| 24 | 40/20/20/10 | 6400 | 2.1 |
| 25 | 40/10/50 | 7700 | 2.0 |

Example 1 to 15 and Comparative Examples 1 to 2

<Preparation of Resist>

The components shown in Table 5 below were dissolved in a solvent to prepare a solution having a solid content concentration of 6 mass %, and the obtained solution was filtered through a 0.1-µm polyethylene filter to prepare a positive resist solution. The positive resist solutions prepared were evaluated by the following methods, and the results are shown in Table 3.

[Image Performance Test]

(Exposure Condition (1))

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 160-nm resist film. The obtained wafer was subjected to pattern exposure by using an ArF excimer laser scanner (PAS5500/1100, manufactured by ASML, NA: 0.75, σo/σi: 0.85/0.55). Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

(Exposure Condition (2))

This condition is for forming a resist pattern by an immersion exposure method using pure water.

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 160-nm resist film. The obtained wafer was subjected to pattern exposure by using an ArF excimer laser immersion scanner (NA: 0.75). The immersion liquid used was ultrapure water having an impurity content of 5 ppb or less. Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

[Profile]

The profile of the obtained pattern was observed by a scanning electron microscope (S-9260, manufactured by Hitachi, Ltd.) and evaluated.

[Pattern Collapse]

An exposure amount for reproducing a 90-nm line-and-space 1:1 pattern was defined as an optimal exposure amount, and the line width at which a pattern, that is, a dense pattern having a line-and-space ratio of 1:1 or an isolated pattern having a line-and-space ratio of 1:10, is resolved without collapse to a finer mask size than that when exposed with an optimal exposure amount, was defined as a threshold pattern collapse line width (nm). A smaller value reveals that a finer pattern is resolved without collapse and pattern collapse is less liable to occur.

[Followability of Water]

The positive resist composition prepared was coated on a silicon wafer and baked at 120° C. for 60 seconds to form a 160-nm resist film. Subsequently, as shown in FIG. 1, pure water 2 was filled between the positive resist solution-coated wafer 1 and a quartz glass substrate 3.

In this state, the quartz glass substrate 3 was horizontally moved (scan) with respect to the surface of the positive resist solution-coated wafer 1, and the pure water 2 following it was observed with an eye. The scan speed of the quartz glass substrate 3 was gradually increased, and the followability of water was evaluated by determining the scan speed limit (nm/sec) where a water droplet starts remaining on the receding side due to failure of the pure water 2 in following the scan speed of the quartz glass substrate 3. A larger speed limit allowing for scanning indicates that water can follow a higher scan speed and the followability of water on the resist film is better.

TABLE 5

| | Composition | | | | | | Evaluation Results | | | | |
| --- | --- | --- | --- | --- | --- | --- | --- | --- | --- | --- | --- |
| | | | | | | | Normal Exposure | | Immersion Exposure | | |
| | Resin (A) (2 g) | Photoacid Generator (mg) | Solvent (mass ratio) | Basic Compound (mg) | Resin (C) (mg) (wt %) | Surfactant (mg) | Profile | Pattern collapse | Profile | Pattern collapse | Follow-ability of Water |
| Example 1 | 1 | z2 (80) | SL-4/SL-2 40/60 | N-5 (7) | C-1 (20) (1.0) | W-1 (3) | rectangular | 30 | rectangular | 30 | 200 |
| Example 2 | 2 | z51 (80) | SL-2/SL-4/SL-6 40/59/1 | N-6 (6) | C-1 (100) (4.8) | W-3 (3) | rectangular | 30 | rectangular | 30 | 200 |
| Example 3 | 3 | z2/Z55 (20/100) | SL-2/SL-4 70/30 | N-3 (6) | C-3 (100) (4.7) | W-1 (3) | rectangular | 30 | rectangular | 30 | 200 |
| Example 4 | 4 | z9 (100) | SL-2/SL-4 60/40 | — | C-1 (2) (0.1) | W-1 (5) | slight T-top | 30 | slight T-top | 30 | 200 |
| Example 5 | 5 | z65/Z9 (20/80) | SL-3/SL-4 30/70 | N-6 (10) | C-3 (30) (1.4) | W-3 (4) | rectangular | 35 | slight T-top | 35 | 150 |
| Example 6 | 6 | z44/Z65 (25/80) | SL-2/SL-4/SL-5 40/58/2 | N-1 (7) | C-3 (30) (1.4) | W-1 (4) | rectangular | 35 | rectangular | 37 | 150 |
| Example 7 | 7 | z55/z47 (30/60) | SL-1/SL-2 60/40 | N-4 (13) | C-4 (20) (0.9) | W-2 (4) | rectangular | 35 | rectangular | 35 | 150 |
| Example 8 | 8 | z44 (80) | SL-1/SL-2 60/40 | N-3 (6) | C-5 (50) (2.4) | W-2 (4) | rectangular | 35 | rectangular | 40 | 250 |
| Example 9 | 9 | z65 (100) | SL-2/SL-4/SL-6 40/59/1 | N-2 (9) | C-5 (10) (0.5) | W-3 (3) | rectangular | 28 | rectangular | 28 | 250 |
| Example 10 | 10 | z15/z37 (80/50) | SL-2/SL-4/SL-6 40/59/1 | N-6 (10) | C-6 (8) (0.4) | — | rectangular | 30 | rectangular | 32 | 250 |
| Example 11 | 11 | z2 (80) | SL-2/SL-4 60/40 | N-1 (7) | C-6 (20) (1.0) | W-4 (3) | rectangular | 28 | rectangular | 28 | 250 |
| Example 12 | 12 | z55/z65 (40/60) | SL-1/SL-2 50/50 | N-3 (6) | C-7 (20) (0.9) | W-4 (3) | rectangular | 28 | rectangular | 28 | 250 |
| Example 13 | 13 | z2/z15 (40/60) | SL-2/SL-4/SL-6 40/59/1 | N-6 (10) | C-8 (15) (0.7) | W-4 (5) | rectangular | 30 | rectangular | 30 | 150 |
| Example 14 | 14 | z25 (120) | SL-2/SL-4/SL-6 40/59/1 | N-1 (7) | C-9 (50) (2.3) | W-2 (5) | rectangular | 40 | rectangular | 40 | 150 |
| Example 15 | 15 | z2 (100) | SL-2/SL-4 60/40 | N-1 (7) | C-10 (30) (1.4) | W-1 (3) | rectangular | 35 | rectangular | 45 | 100 |
| Comparative Example 1 | 1 | z2 (100) | SL-2/SL-4 60/40 | N-5 (7) | — | W-1 (5) | film loss | 80 | film loss | 80 | 50 |
| Comparative Example 2 | 1 | z51 (100) | SL-2/SL-4 60/40 | N-2 (10) | C-1 (500) (23.6) | W-1 (5) | T-top | 80 | T-top | 80 | 200 |

The symbols in Table 5 denote the followings.

N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: Polysiloxane polymer KP-341 (produced by Shin-Etsu Chemical Co., Ltd.) (silicon-containing)
W-4: Troysol S-366 (produced by Troy Chemical)
W-5: PF656 (produced by OMNOVA) (fluorine-containing)
W-6: PF6320 (produced by OMNOVA) (fluorine-containing)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate As seen from the results in Table 5, the positive resist composition of the present invention is excellent with respect to profile and pattern collapse at normal exposure and immersion exposure and assured of excellent followability of water at the immersion exposure.

Examples 16 to 28 and Comparative Examples 3 to 4

<Preparation of Resist>

The components shown in Table-6 below were dissolved in a solvent to prepare a solution having a solid content concentration of 6 mass %, and the obtained solution was filtered through a 0.1-μm polyethylene filter to prepare a positive resist solution. The positive resist solutions prepared were evaluated by the following methods, and the results are shown in Table 6.

[Image Performance Test]

(Exposure Condition (1))

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 160-nm resist film. The obtained wafer was subjected to pattern exposure by using an ArF excimer laser scanner (PAS5500/1100, manufactured by ASML, NA: 0.75, σo/σi: 0.85/0.55). Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

(Exposure Condition (2))

This condition is for forming a resist pattern by an immersion exposure method using pure water.

An organic antireflection film, ARC29A (produced by Nissan Chemical Industries, Ltd.), was coated on a silicon wafer and baked at 205° C. for 60 seconds to form a 78-nm antireflection film, and the positive resist solution prepared above was coated thereon and baked at 120° C. for 60 seconds to form a 160-nm resist film. The obtained wafer was subjected to pattern exposure by using an ArF excimer laser immersion scanner (NA: 0.75). The immersion liquid used was ultrapure water having an impurity content of 5 ppb or less. Thereafter, the resist film was heated at 120° C. for 60 seconds, developed with an aqueous tetramethylammonium hydroxide solution (2.38 mass %) for 30 seconds, rinsed with pure water and spin-dried to obtain a resist pattern.

[Profile]

The profile of the obtained pattern was evaluated by observing it through a scanning electron microscope (S-9260, manufactured by Hitachi, Ltd.).

[Pattern Collapse]

An exposure amount for reproducing a 90-nm line-and-space 1:1 mask pattern was defined as an optimal exposure amount, and the line width at which a pattern, that is, a dense pattern having a line-and-space ratio of 1:1 or an isolated pattern having a line-and-space ratio of 1:10, is resolved without collapse to a finer mask size when exposed with an optimal exposure amount, was defined as a threshold pattern-collapse line width (nm). A smaller value reveals that a finer pattern is resolved without collapse and pattern collapse is less liable to occur.

[Followability of Water]

The positive resist solution prepared was coated on a silicon wafer and baked at 120° C. for 60 seconds to form a 160-nm resist film. Subsequently, as shown in FIG. 1, pure water 2 was filled between the obtained positive resist solution-coated wafer 1 and a quartz glass substrate 3.

In this state, the quartz glass substrate 3 was horizontally moved (scan) with respect to the surface of the positive resist solution-coated wafer 1, and the pure water 2 following it was observed with an eye. The scan speed of the quartz glass substrate 3 was gradually increased, and the followability of water was evaluated by determining the scan speed limit (nm/sec) where a water droplet starts remaining on the receding side due to failure of the pure water 2 in following the scan speed of the quartz glass substrate 3. A larger speed limit allowing for scanning indicates that water can follow a higher scan speed and the followability of water on the resist film is better.

[Evaluation of Sensitivity]

An antireflection film (ARC25, produced by Brewer Science Co., Ltd.) was uniformly coated on a silicon substrate by a spin coater to a thickness of 600 angstrom and dried at 190° C. for 240 seconds. Thereafter, each positive resist composition was coated by a spin coater, and the wafer was dried under heating at 115° C. for 60 seconds to form a resist film of 0.25 μm. The sensitivity of this resist film at the exposure of 193 nm was evaluated by using an immersion exposure/dissolution behavior analyzer IMES-5500 (manufactured by Litho Tech Japan Corp.) equipped with a 193-nm laser and using water as the immersion liquid.

The sensitivity as used herein indicates a minimum exposure amount of giving a film thickness of 0 when the wafer after exposure was dried under heating at 120° C. for 90 seconds, developed at 23° C. for 30 seconds by using an aqueous 2.38 mass % tetramethylammonium hydroxide solution, rinsed with pure water for 30 seconds and dried and then, the film thickness was measured.

TABLE 6

| | Composition | | | | | | |
|---|---|---|---|---|---|---|---|
| | Resin (2 g) | Photoacid Generator (mg) | Solvent (mass ratio) | Basic Compound (mg) | Resin (C) (mg) (wt %) | Surfactant (mg) | Additive (H) (mg) |
| Example 16 | 2 | z51 (80) | SL-2/SL-4/SL-6 40/59/1 | N-6 (6) | C-1 (150) (7.2) | W-3 (3) | — |
| Example 17 | 7 | z55/z47 (30/60) | SL-1/SL-2 60/40 | N-4 (13) | C-11 (20) (0.9) | W-2 (4) | — |
| Example 18 | 16 | z55/z51 (45/45) | SL-2/SL-4 60/40 | N-1 (10) | C-2 (50) (2.3) | W-4 (2) | — |
| Example 19 | 17 | z55/Z23 (100/25) | SL-2/SL-4 60/40 | N-5/N-1 (7/7) | C-12 (50) (2.3) | W-4 (2) | — |
| Example 20 | 18 | z55/Z65 (75/75) | SL-2/SL-4 60/40 | N-5/N-1 (7/7) | C-13 (50) (2.3) | W-4 (2) | — |
| Example 21 | 19 | z2 (80) | SL-2 100 | N-7 (7) | C-14 (50) (2.3) | W-3 (2) | — |
| Example 22 | 20 | z2 (80) | SL-1 100 | N-7 (7) | C-15 (50) (2.3) | W-1 (2) | — |
| Example 23 | 21 | z23/z74 (50/50) | SL-2/SL-5 60/40 | N-3 (6) | C-16 (100) (4.7) | W-1 (2) | — |
| Example 24 | 22 | z2/z42 (50/40) | SL-2/SL-5 60/40 | N-3 (6) | C-17 (100) (4.7) | W-1 (2) | — |
| Example 25 | 23 | z2 (80) | SL-2/SL-3 60/40 | N-7 (7) | C-18 (100) (4.7) | W-1 (2) | — |
| Example 26 | 24 | z2/z15 (50/75) | SL-/SL-3 60/40 | N-4 (6) | C-19 (120) (5.6) | W-1 (3) | — |
| Example 27 | 25 | z30/z12 (50/75) | SL-2 100 | N-8 (7) | C-20 (120) (5.6) | W-1 (2) | — |
| Comparative Example 28 | 1 | z9 (100) | SL-2/SL-4/SL-6 40/59/1 | N-2 (10) | C-1 (300) (14.2) | W-1 (5) | — |
| Comparative Example 3 | 9 | z65 (100) | SL-2/SL-4/SL-6 40/59/1 | N-2 (9) | — | W-3 (3) | H-1 (5) |
| Comparative Example 4 | 1/9 (1/1) | z65 (100) | SL-2/SL-4/SL-6 40/59/1 | N-2 (9) | — | W-3 (3) | — |

| | Evaluation Results | | | | | |
|---|---|---|---|---|---|---|
| | Normal Exposure | | Immersion Exposure | | | Followability of |
| | Profile | Pattern collapse | Profile | Pattern collapse | Sensitivity, mJ | Water |
| Example 16 | rectangular | 40 | rectangular | 40 | 6.0 | 200 |
| Example 17 | rectangular | 28 | rectangular | 28 | 6.0 | 250 |
| Example 18 | rectangular | 30 | rectangular | 30 | 6.5 | 230 |
| Example 19 | rectangular | 28 | rectangular | 28 | 6.7 | 200 |
| Example 20 | rectangular | 30 | rectangular | 30 | 6.0 | 250 |
| Example 21 | rectangular | 30 | rectangular | 30 | 6.5 | 250 |
| Example 22 | rectangular | 28 | rectangular | 28 | 6.7 | 250 |
| Example 23 | rectangular | 30 | rectangular | 30 | 6.0 | 250 |
| Example 24 | rectangular | 28 | rectangular | 28 | 6.0 | 250 |
| Example 25 | rectangular | 33 | rectangular | 33 | 6.5 | 250 |
| Example 26 | rectangular | 30 | rectangular | 30 | 6.0 | 230 |
| Example 27 | rectangular | 29 | rectangular | 29 | 6.0 | 240 |
| Comparative Example 28 | Slight T-top | 50 | Slight T-top | 50 | 6.0 | 200 |
| Comparative Example 3 | rectangular | 80 | rectangular | 80 | 6.0 | 50 |
| Comparative Example 4 | rectangular | 80 | rectangular | 80 | 6.0 | 50 |

The symbols in Table 6 denote the followings.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
W-1: Megafac F176 (produced by Dainippon Ink & Chemicals, Inc.) (fluorine-containing)
W-2: Megafac R08 (produced by Dainippon Ink & Chemicals, Inc.) (fluorine- and silicon-containing)
W-3: Polysiloxane polymer KP-341 (produced by Shin-Etsu Chemical Co., Ltd.) (silicon-containing)
W-4: Troysol S-366 (produced by Troy Chemical)
W-5: PF656 (produced by OMNOVA) (fluorine-containing)
W-6: PF6320 (produced by OMNOVA) (fluorine-containing)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate

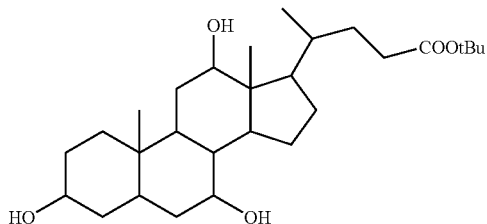

(H-1)

Additive (H-1) used in Comparative Example 3 is a compound used for comparison and contrast with the resin as the component (C).

As seen from the results in Table 6, the positive resist composition of the present invention is excellent with respect to the profile and pattern collapse at normal exposure and immersion exposure and furthermore, is excellent with respect to the followability of water and sensitivity at the immersion exposure.

According to the present invention, a positive resist composition improved in the profile and pattern collapse and a pattern forming method using the positive resist composition can be provided. Furthermore, a positive resist composition suitable for immersion exposure, ensuring that the profile and pattern collapse are not changed at immersion exposure and the followability for water is good, and a pattern forming method using the positive resist composition, can be provided.

The entire disclosure of each and every foreign patent application from which the benefit of foreign priority has been claimed in the present application is incorporated herein by reference, as if fully set forth.

What is claimed is:
1. A positive resist composition, which comprises:
(A) a resin having a monocyclic or polycyclic alicyclic hydrocarbon structure, of which solubility in an alkali developer increases under an action of an acid;
(B) a compound capable of generating an acid upon irradiation with actinic rays or radiation;
(C) a resin having a repeating unit represented by formula (C) and not containing either a silicon atom or a fluorine atom; and
(D) a solvent,
wherein a content of the resin as the component (C) is from 0.1 to 20 mass % based on a solid content of the positive resist composition:

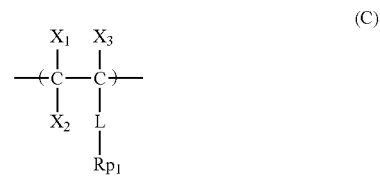

(C)

wherein $X_1$, $X_2$ and $X_3$ each independently represents a hydrogen atom, an alkyl group or a halogen atom;
L represents a single bond or a divalent linking group; and
$Rp_1$ represents an acid-decomposable group.

2. The positive resist composition according to claim 1, wherein the resin as the component (C) further has a repeating unit represented by formula (C2):

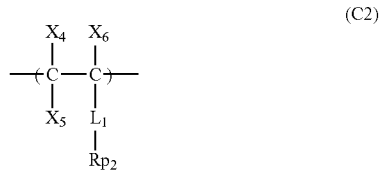

(C2)

wherein $X_4$, $X_5$ and $X_6$ each independently represents a hydrogen atom, an alkyl group or a halogen atom;
$L_1$ represents a single bond or a divalent linking group; and
$Rp_2$ represents a non-acid-decomposable group.

3. The positive resist composition according to claim 1, wherein a content of the resin as the component (C) is from 0.1 to 5 mass % based on a solid content of the positive resist composition.

4. The positive resist composition according to claim 1, wherein formula (C) is represented by formula (C 1):

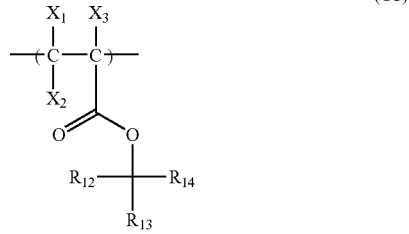

(C1)

wherein $X_1$, $X_2$ and $X_3$ each independently represents a hydrogen atom, an alkyl group or a halogen atom; and
$R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring.

5. The positive resist composition according to claim 4, wherein in formula (C), $R_{12}$, $R_{13}$ and $R_{14}$ each independently represents an alkyl group or an alkenyl group and at least one of $R_{12}$, $R_{13}$ and $R_{14}$ represents an alkyl group.

6. The positive resist composition according to claim 1, wherein the resin as the component (C) comprises a repeating unit represented by formula (C1) and a repeating unit represented by formula (C2) in a proportion of from 80 to 100 mol % in total repeating units:

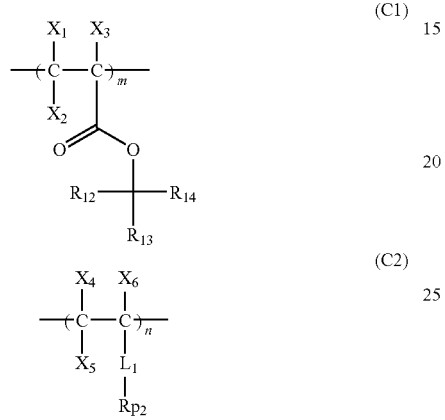

wherein $X_1$, $X_2$, $X_3$, $X_4$, $X_5$ and $X_6$ each independently represents a hydrogen atom, an alkyl group or a halogen atom;

$R_{12}$, $R_{13}$ and $R_{14}$ each independently represents an alkyl group, a cycloalkyl group, an alkenyl group or an aryl group, or a monovalent group formed by bonding at least two of these groups, provided that at least one of $R_{12}$, $R_{13}$ and $R_{14}$ represents an alkyl group, and two members out of $R_{12}$, $R_{13}$ and $R_{14}$ may combine to form a ring;

$L_1$ represents a single bond or a divalent linking group;

$Rp_2$ represents a non-acid-decomposable group; and m and n each represents a molar ratio of the repeating unit, and m=10 to 100, n=0 to 90 and m+n=100.

7. The positive resist composition according to claim 1, wherein the resin as the component (C) comprises at least one repeating unit selected from formulae (C-I) to (C-IV) in a proportion of from 80 to 100 mol % in total repeating units, provided that the repeating unit represented by formula (C-I) is used in combination with the repeating unit represented by formula (C-II):

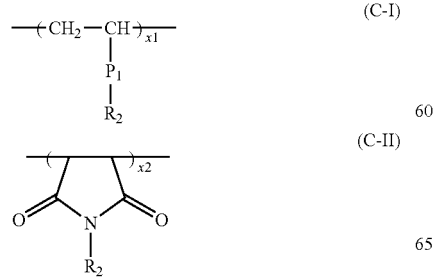

-continued

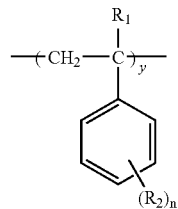

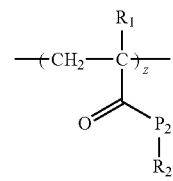

wherein $R_1$ represents a hydrogen atom or a methyl group;

$R_2$ represents a hydrocarbon group having two or more —$CH_3$ partial structures, provided that when a plurality of $R_2$'s are present, the plurality of $R_2$'s may be the same or different;

$P_1$ represents a single bond, an alkylene group or an ether group, or a linking group having two or more thereof;

$P_2$ represents a linking group selected from —O—, —NR— and —$NHSO_2$—, wherein R represents a hydrogen atom or an alkyl group;

x1, x2, y and z represent mol % in total repeating units, and x1 represents a number of 0 to 50, x2 represents a number of 0 to 50, y represents a number of 0 to 100, z represents a number of 0 to 100, provided that x1, x2, y and z satisfy $80 \leq x1+x2+y+z \leq 100$; and n represents an integer of from 1 to 4.

8. The positive resist composition according to claim 1, wherein the resin (A) contains at least a (meth)acrylate-based repeating unit having a lactone structure and a (meth)acrylate-based repeating unit having an acid-decomposable group.

9. The positive resist composition according to claim 1, wherein the resin as the component (A) has a repeating unit represented by formula (A1), a repeating unit represented by formula (A2) and a repeating unit represented by formula (A3):

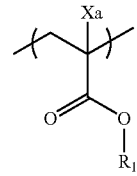

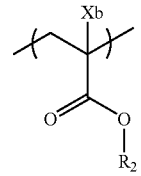

-continued

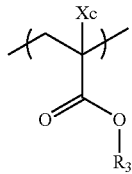
(A3)

wherein Xa, Xb and Xc each independently represents a hydrogen atom or a methyl group;

$R_1$ represents a monovalent organic group having a lactone structure;

$R_2$ represents a monovalent organic group having a hydroxyl group or a cyano group; and $R_3$ represents a group capable of being detached under an action of an acid.

10. A pattern forming method, which comprises:

forming a resist film from a positive resist composition according to claim 1; and exposing and developing the resist film.

11. The pattern forming method according to claim 10, wherein the exposure is performed through an immersion liquid.

12. The positive resist composition according to claim 1, wherein the compound as the component (B) has a triphenylsulfonium cation structure.

13. The positive resist composition according to claim 1, which further comprises a surfactant.

14. The positive resist composition according to claim 1, which further comprises a basic compound.

15. The positive resist composition according to claim 1, wherein the solvent as component (D) includes a solvent not containing a hydroxyl group.

16. The positive resist composition according to claim 1, wherein the solvent as component (D) includes γ-butyrolactone.

17. The positive resist composition according to claim 1, wherein the solvent as component (D) includes propylene carbonate.

* * * * *